(12) United States Patent
Takashima

(10) Patent No.: US 7,903,446 B2
(45) Date of Patent: Mar. 8, 2011

(54) SEMICONDUCTOR MEMORY DEVICE

(75) Inventor: Daisaburo Takashima, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 88 days.

(21) Appl. No.: 12/401,184

(22) Filed: Mar. 10, 2009

(65) Prior Publication Data
US 2009/0231902 A1 Sep. 17, 2009

(30) Foreign Application Priority Data

Mar. 11, 2008 (JP) ................... 2008-061586

(51) Int. Cl.
*G11C 11/22* (2006.01)
(52) U.S. Cl. ........................ 365/145; 365/158
(58) Field of Classification Search .................. 365/145, 365/158
See application file for complete search history.

(56) References Cited

U.S. PATENT DOCUMENTS

| | | | |
|---|---|---|---|
| 6,353,550 B1* | 3/2002 | Hirano | 365/145 |
| 7,269,048 B2 | 9/2007 | Takashima | |
| 7,379,319 B2 | 5/2008 | Takashima | |
| 2005/0063214 A1 | 3/2005 | Takashima | |
| 2008/0205117 A1 | 8/2008 | Takashima | |

FOREIGN PATENT DOCUMENTS

| | | |
|---|---|---|
| JP | 6-236969 | 8/1994 |
| JP | 10-255483 | 9/1998 |
| JP | 11-177036 | 7/1999 |
| JP | 2000-22010 | 1/2000 |
| JP | 2005-209321 | 8/2005 |
| JP | 2005-209324 | 8/2005 |

OTHER PUBLICATIONS

Masao Taguchi, et al., "A Capacitance-Coupled Bit Line Cell", IEEE Transactions on Electron Devices, vol. ED-32, No. 2, Feb. 1985, pp. 290-295.

* cited by examiner

*Primary Examiner* — Michael T Tran
(74) *Attorney, Agent, or Firm* — Oblon, Spivak, McClelland, Maier & Neustadt, L.L.P.

(57) ABSTRACT

A memory includes ferroelectric capacitors; cell transistors each including a drain connected to one electrode of each ferroelectric capacitor, and a gate connected to the word line; and memory cell blocks each including a reset transistor, a block selection transistor, and memory cells including the ferroelectric capacitors and the cell transistors, wherein sources of the cell transistors are connected to the plate lines, the other electrode of the ferroelectric capacitor is connected to one of the sub-bit lines, a source and a drain of the block selection transistor are connected to one of the sub-bit lines and one of the bit lines, a source of the reset transistor is connected to one of the plate lines or a fixed potential, and a drain of the reset transistor in each memory cell block is connected to one of the sub-bit lines, and the memory cell blocks configure a memory cell array.

11 Claims, 40 Drawing Sheets

SIXTH EMBODIMENT

SECOND EMBODIMENT

FIG. 4  THIRD EMBODIMENT

FIG. 5  FOURTH EMBODIMENT

FIFTH EMBODIMENT

SIXTH EMBODIMENT

SEVENTH EMBODIMENT

FIG. 18  EIGHTH EMBODIMENT

FIG. 23 NINTH EMBODIMENT

FIG. 29 TENTH EMBODIMENT

FIG. 31 ELEVENTH EMBODIMENT

TWELFTH EMBODIMENT

THIRTEENTH EMBODIMENT

SEMICONDUCTOR MEMORY DEVICE

CROSS-REFERENCE TO RELATED APPLICATIONS

This application is based upon and claims the benefit of priority from the prior Japanese Patent Application No. 2008-61586, filed on Mar. 11, 2008, the entire contents of which are incorporated herein by reference.

BACKGROUND OF THE INVENTION

1. Field of the Invention

The present invention relates to a semiconductor memory device, and more particularly to a nonvolatile ferroelectric memory.

2. Related Art

Semiconductor memories are used for main memories of large-sized computers, personal computers, household electrical appliances, mobile phones or the like. Nonvolatile ferroelectric memories using ferroelectric capacitors can rewrite at 1012 or more times, have about the same reading/writing times as those of DRAMs, and can operate at a low voltage (1 V to 5 V, for example).

Ferroelectric memories described in Japanese Patent Application Laid-open Nos. H10-255483, H11-177036, and No. 2000-22010 can achieve a high-speed operation of plate lines by sharing the plate lines and plate-line driving circuits. However, on the other hand, a reading charge and a writing charge are transmitted from memory cells to bit lines or from bit lines to memory cells, via plural cell transistors connected in series. Therefore, addition of a delay component (parasitic capacitance) of the series cell transistors occurs in the bit lines, resulting in a limitation of the high-speed operation of the memories. When the number of series-connected memory cells is decreased, this delay component (parasitic capacitance) is decreased. However, chips cannot be downscaled.

Japanese Patent Application Laid-open No. 2005-209321 proposes a ferroelectric memory having a system that solves operation delay due to serial connection of memory cells. However, a unit cell of the ferroelectric memory described in Japanese Patent Application Laid-open No. 2005-209321 is larger than unit cells described in Japanese Patent Application Laid-open Nos. H10-255483, H11-177036, and No. 2000-22010. Therefore, the ferroelectric memory described in Japanese Patent Application Laid-open No. 2005-209321 operates faster than the ferroelectric memories described in Japanese Patent Application Laid-open Nos. H10-255483, H11-177036, and No. 2000-22010, but the unit cell is larger than those of the ferroelectric memories described in Japanese Patent Application Laid-open Nos. H10-255483, H11-177036, and No. 2000-22010.

SUMMARY OF THE INVENTION

A semiconductor memory device according to an embodiment of the present invention comprises: word lines; bit lines; plate lines; sub-bit lines connected to the bit lines; ferroelectric capacitors each including a ferroelectric substance between two electrodes; cell transistors each including a drain connected to one electrode of each ferroelectric capacitor, and a gate connected to the word line or functioning as the word line; and memory cell blocks each including a reset transistor, a block selection transistor, and a plurality of memory cells including the ferroelectric capacitors and the cell transistors, wherein
sources of the cell transistors of the memory cells are connected to the plate lines, the other electrode of the ferroelectric capacitor of each of the memory cells is connected to one of the sub-bit lines, a source and a drain of the block selection transistor in each memory cell block are connected to one of the sub-bit lines and one of the bit lines, respectively, a source of the reset transistor in each memory cell block is connected to one of the plate lines or a fixed potential, and a drain of the reset transistor in each memory cell block is connected to one of the sub-bit lines, and
a plurality of the memory cell blocks configure a memory cell array.

A semiconductor memory device according to an embodiment of the present invention comprises: word lines; bit lines; plate lines; sub-bit lines connected to the bit lines; ferroelectric capacitors each including a ferroelectric substance between two electrodes; cell transistors each including a drain connected to one electrode of each ferroelectric capacitor, and a gate connected to the word line or functioning as the word line; a first memory cell block including a first reset transistor, a first block selection transistor, and a plurality of memory cells including the ferroelectric capacitors and the cell transistors; and a second memory cell block including a second reset transistor, a second block selection transistor, and a plurality of memory cells including the ferroelectric capacitors and the cell transistors, the second memory cell block being adjacent to the first memory cell block, wherein
in the first memory cell block, sources of the cell transistors of the memory cells are connected to the plate lines, the other electrode of the ferroelectric capacitor of each of the memory cells is connected to a first sub-bit line of the sub-bit lines, a source of the first reset transistor is connected to the plate line or a fixed potential, a drain of the first reset transistor is connected to the first sub-bit line, a source of the first block selection transistor is connected to the first sub-bit line, and a drain of the first block selection transistor is connected to one of the bit lines, and
in the second memory cell block, sources of the cell transistors of the memory cells are connected to the plate lines, the other electrode of the ferroelectric capacitor of each of the memory cells is connected to a second sub-bit line of the sub-bit lines, a source of the second reset transistor is connected to the plate line or a fixed potential, a drain of the second reset transistor is connected to the second sub-bit line, a source of the second block selection transistor is connected to the second sub-bit line, and a drain of the second block selection transistor is connected to one of the bit lines.

A semiconductor memory device according to an embodiment of the present invention comprises: word lines; bit lines; plate lines; sub-bit lines connected to the bit lines; ferroelectric capacitors each including a ferroelectric substance between two electrodes; cell transistors each including a drain connected to one electrode of each ferroelectric capacitor, and a gate connected to the word line or functioning as the word line; and memory cell blocks each including a reset transistor, a block selection transistor, and a plurality of memory cells including the ferroelectric capacitors and the cell transistors, wherein
when a data read operation or a data write operation is finished, a potential of the bit lines is returned to a potential of the bit lines in a standby state in which a data read operation or a data write operation is not performed, and thereafter, a potential of a word line selected from the word lines is returned to a potential of the word line in the standby state, and
thereafter, a word line different from the word line selected in the data read operation or the data write operation is started to reset a potential of a cell node between the ferroelectric capacitor and the cell transistor to a potential of the plate line.

DETAILED DESCRIPTION OF THE INVENTION

Embodiments of the present invention will be explained below in detail with reference to the accompanying drawings. Note that the invention is not limited thereto.

First Embodiment

Figure 1A:
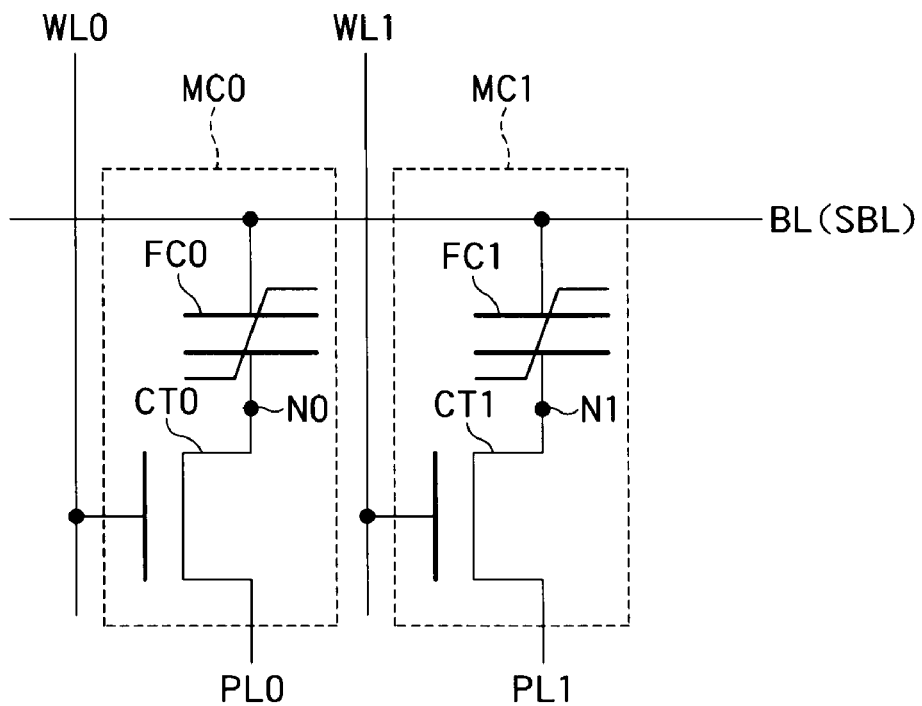
FIG. 1A and FIG. 1B are, respectively, a circuit diagram and a cross-sectional view showing memory cells of a ferroelectric memory according to a first embodiment of the present invention.
Figure 1B:
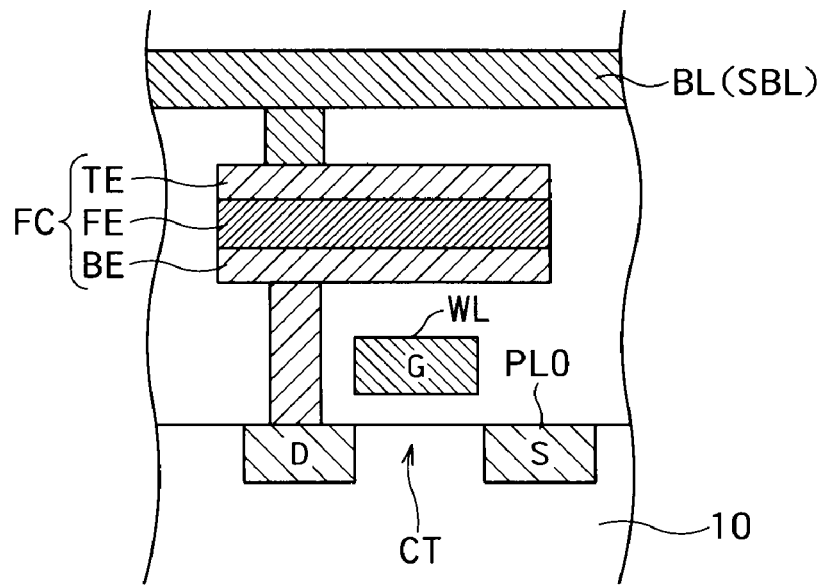

FIG. 1A and FIG. 1B are, respectively, a circuit diagram and a cross-sectional view showing memory cells of a ferroelectric memory according to a first embodiment of the present invention. Each memory cell MCi (i is an integer) includes a ferroelectric capacitor FCi and a cell transistor CTi. The ferroelectric capacitor FCi of each memory cell MCi includes an upper electrode TE, a lower electrode BE, and a ferroelectric layer FE provided between the upper electrode TE and the lower electrode BE. The cell transistor CTi has a gate electrode G, a source layer S, and a drain layer D. The gate electrode G can be connected to a word line WLi, alternately the word line WLi can function as the gate electrode G. The source layer S can be connected to a plate line PLi, alternately the source layer S can function as the plate line PLi. The drain layer D is connected to the lower electrode BE via a contact plug. The upper electrode TE of the ferroelectric capacitor FCi is connected to a bit line BL or a sub-bit line SBL via a contact plug. As explained above, the ferroelectric capacitor FCi and the cell transistor CTi are connected in series between the bit line BL (the sub-bit line SBL) and the plate line PLi. In the first embodiment, the ferroelectric capacitor is arranged at a bit line BL side, and the cell transistor CTi is arranged at a plate line PL side. A node between the ferroelectric capacitor FCi and the cell transistor CTi is Ni.

A word line WL and a bit line BL are orthogonal with each other. Each memory cell MC is arranged at each intersection between the word line WL and the bit line BL. The plate line PL is provided corresponding to the word line WL, and is formed by a diffusion layer extended to an extending direction of each word line WL. While plural bit lines BL are actually provided, FIG. 1 shows only one bit line BL.

As shown in FIG. 1B, a ferroelectric capacitor FC is arranged between the cell transistor CT and the bit line BL (the sub-bit line SBL). Because the ferroelectric capacitor FC can be provided below the bit line BL (the sub-bit line SBL), and because the cell transistor CT can be provided below the ferroelectric capacitor FC, a bit line contact does not need to be provided between the adjacent ferroelectric capacitors FC. Therefore, an area of the ferroelectric capacitor FC can be increased while decreasing a size of the memory cell MC.

Further, because the bit line BL (the sub-bit line SBL) is provided above the ferroelectric capacitor FC based on a substrate 10, the bit line BL can be formed using a normal metal wiring (such as Al or Cu) used for a peripheral logic circuit controlling the memory. That is, the ferroelectric memory according to the first embodiment can be easily embedded with the logic circuit.

On the other hand, when the bit line BL (the sub-bit line SBL) is provided below the ferroelectric capacitor FC, a high resistance wiring (for example, a metal such as tungsten, and silicide such as WSi, CoSi, and NiSi) that can bear heat treatment at the time of forming the ferroelectric capacitor is necessary. Because an additional high resistance wiring that is not necessary for the logic circuit becomes necessary for a memory region, logic embedded memories become expensive. In this case, because the bit line BL (the sub-bit line SBL) is surrounded by the ferroelectric capacitor FC, this has a disadvantage in that the bit line capacitance becomes large.

As explained above, according to the first embodiment, there is no bit line contact between the adjacent ferroelectric capacitors FC, and the bit line BL (the sub-bit line SBL) is provided above the ferroelectric capacitor FC. Therefore, this configuration is excellent for downscaling, has small bit line capacitance, and is advantageous for logic embedded memories.

Figure 2:
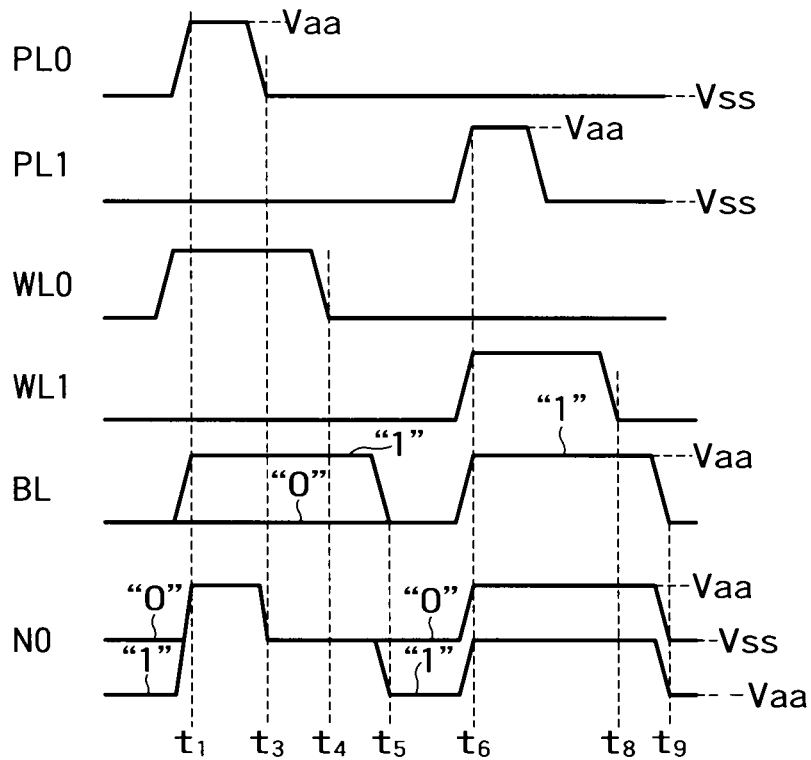
FIG. 2 is a timing diagram showing a write operation of writing data "1" or "0" into a memory cell MC0, and thereafter writing data "1" into a memory cell MC1.

However, as shown in FIG. 2, when the memory is operated, potential amplitude of a node N0 becomes large, and can have a problem in reliability. FIG. 2 is a timing diagram showing a write operation of writing data "1" or "0" into a memory cell MC0, and thereafter writing data "1" into a memory cell MC1.

More specifically, a potential of a word line WL0 is increased, thereby setting a cell transistor CT0 to an on state (conduction state). A word line WL1 maintains a logic low state. Immediately after this operation at t1, a potential of a plate PL0 is increased to a high level potential Vaa. As a result, a potential of the node N0 becomes Vaa. A potential of a plate PL1 remains at a low level potential Vss. At the time of writing data "1", a potential of the bit line BL is increased to Vaa at t1. At the time of writing data "0", the potential of the bit line BL is maintained at Vss at t0. Vss is a ground potential (0 V) or a source potential, for example, and Vaa is a power source potential higher than Vss.

At t3, when the potential of the plate line PL is decreased to Vss, the potential of the node N0 decreases to Vss. At t4, the potential of the word line WL0 is decreased, and a cell transistor CT0 is set to an off state (non-conduction state). Thereafter, at the time of writing data "1", the potential of the bit line BL decreases to Vss at 5. As a result, the potential of the node N0 decreases to −Vaa based on a capacitance coupling between the bit line BL and the node N0. At the time of writing data "0", the potential of the bit line BL is maintained at Vss at t5. Therefore, the potential of the node N0 maintains Vss.

Next, the memory cell MC1 sharing the bit line BL with the memory cell MC0 is selected, and data "1" is written into the memory cell MC1. More specifically, the potential of the word line WL1 is increased, and a cell transistor CT1 is set to the on state. The word line WL0 maintains the logic low state. Immediately after this state at t6, the potential of the plate PL1 is increased to the high level potential Vaa. Further, data "1" is written. Therefore, at t6, the potential of the bit line BL is increased to Vaa. At this time, the potential of the node N0 varies based on a capacitance coupling between the bit line BL and the node N0. When data "1" is written into MC0 during a period from t1 to t5, the potential of the node N0 becomes Vss at t6. When data "0" is written into MC0 during a period from t1 to t5, the potential of the node N0 becomes Vaa at t6.

Thereafter, the word line WL1 is decreased to the logic low state at t8, and the potential of the bit line BL is decreased to Vss. When data "1" is written into MC0 during the period from t1 to t5, the potential of the node N0 becomes −Vaa at t9. When data "0" is written into MC0 during the period from t1 to t5, the potential of the node N0 becomes Vss at t9.

According to a driving method shown in FIG. 2, the node N0 oscillates between the potentials −Vaa and Vaa. That is, potential amplitude of the node N0 becomes 2×Vaa which is two times the amplitude of the bit line BL. In this way, large amplitude of the node N0 leads to deterioration of reliability of the cell transistor CTi and the ferroelectric capacitor FCi. When a potential of a well or a substrate on which the cell transistor CTi is formed is Vss, and also when the node N0 decreases to −Vaa, a PN junction between an N-type drain and a P-type well (the substrate) is biased in a forward direction.

Second Embodiment

Figure 3:
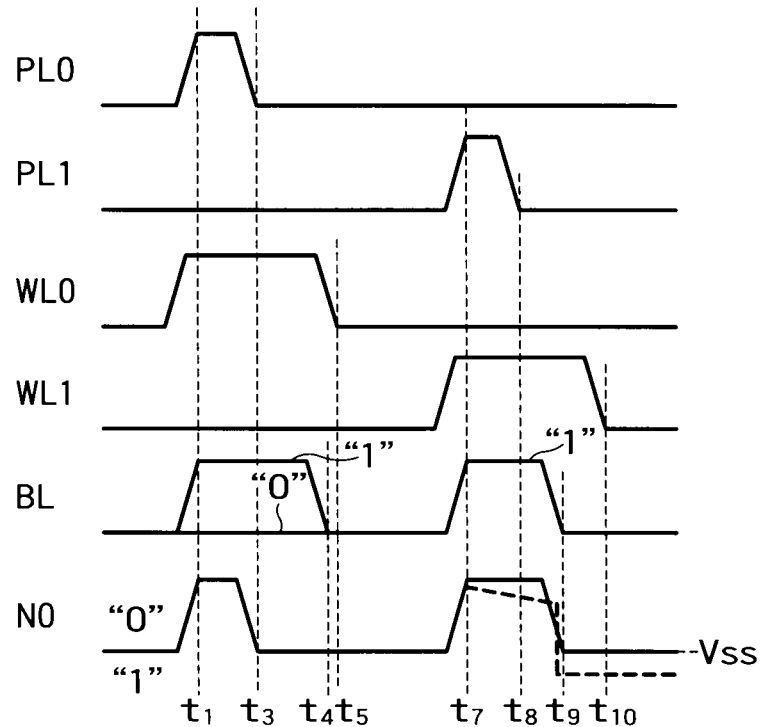
FIG. 3 is a timing diagram showing a write operation of writing data into a ferroelectric memory according to a second embodiment of the present invention.

FIG. 3 is a timing diagram showing a write operation of writing data into a ferroelectric memory according to a second embodiment of the present invention. In the second embodiment, before a potential of the word line WL0 is decreased at t5, a potential of the bit line BL is decreased at t4. Accordingly, the potential of the bit line BL returns to Vss before the cell transistor CT0 becomes in the off state. Therefore, the node N0 is not affected by the capacitance coupling between the bit line BL and the node N0. Consequently, the potential of the node N0 does not depend on written data and is maintained at Vss during a standby period until near t3 to t7. That is, the second embodiment can solve the problem of the first embodiment.

Even when the memory cell MC1 sharing the bit line BL with the memory cell MC0 is selected, and when the potential of the bit line BL varies from Vss to Vaa, the potential of the node N0 varies only from Vss to Vaa based on the capacitance coupling between the bit line BL and the node N0. That is, the potential amplitude of the node N0 can be restricted to Vaa which is the same as the potential amplitude of the bit line. Accordingly, the reliability of the memory can be improved while decreasing a cell size.

However, the ferroelectric memory according to the second embodiment still has a problem of disturbance. For example, after data "1" is written into the memory cell MC0, when other memory cell sharing the bit line BL with the memory cell MC0 is continuously selected, the potential of the bit line BL becomes Vaa during a long period of time. In this case, the node N0 becomes Vaa during a long period of time based on the capacitance coupling between the node N0 and the bit line BL. Consequently, this has a risk that the potential of the node N0 continuously falls from Vaa to break data "1" due to a leak at a PN junction between the N-type drain layer D connected to the cell node N0 and the P-type well (the substrate) (see a broken line in FIG. 3).

Third Embodiment

Figure 4:
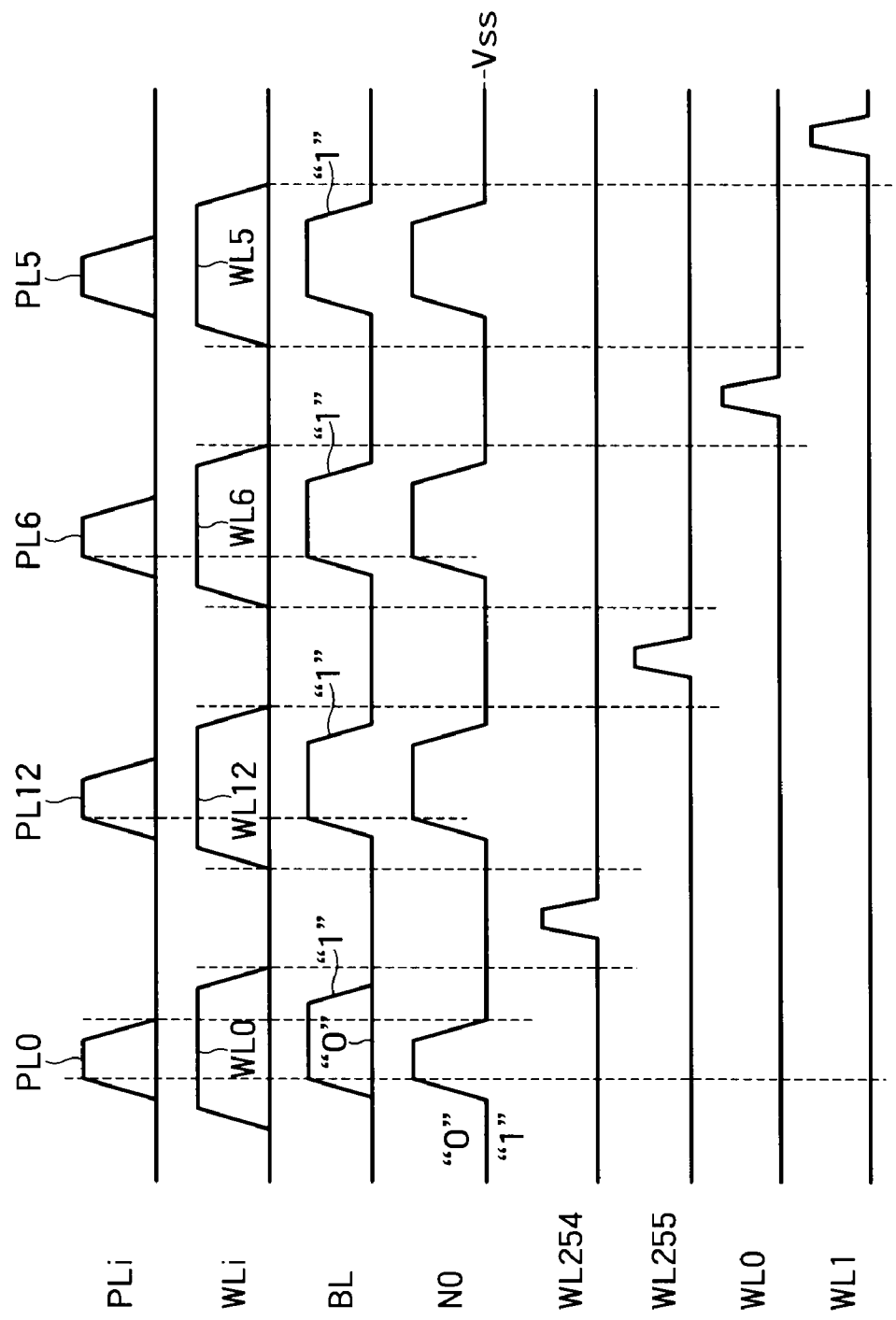
FIG. 4 is a timing diagram showing a write operation of writing data into a ferroelectric memory according to a third embodiment of the present invention.

FIG. 4 is a timing diagram showing a write operation of writing data into a ferroelectric memory according to a third embodiment of the present invention. The third embodiment is similar to the second embodiment in that before a potential of the word line WLi is decreased, a potential of the bit line BL is decreased to Vss. Therefore, potential amplitudes of the cell nodes N0 and N1 are Vaa.

In the third embodiment, before a next word line is selected after a selected word line WLi returns to the logic low state, a word line other than the selected word line WLi is increased. Accordingly, the cell node Ni is short-circuited to the plate line PLi, and the potential of the cell node Ni changed by the disturbance is reset to Vss. To reset the disturbance, potentials of word lines are sequentially increased each time when the word line WL is selected to write data.

In FIG. 4, after the word line WL0 is selected to write data, a potential of a word line WL254 is increased. Accordingly, cell nodes of all memory cells MC connected to the word line WL254 are reset to Vss. After a word line WL12 is selected, a potential of a word line WL255 is increased. Accordingly, cell nodes of all memory cells MC connected to the word line WL255 are reset to Vss. Similarly, after a word line WL6 is selected, cell nodes of all memory cells MC connected to the word line WL0 are reset to Vss. After the word line WL5 is selected, cell nodes of all memory cells MC connected to the word line WL1 are reset. Word lines of which potentials are increased to reset the cell nodes of the memory cells MC are sequentially driven in the order of WL0, WL1, . . . , WL254, WL255, WL0, . . . .

Accordingly, the problem of disturbance can be solved while decreasing a cell size and maintaining the reliability of the memory cells. Because the disturbance can be solved, the plate line PL can be shared by plural word lines. Consequently, the plate can be driven at high speed, and a plate driving circuit can be shared. The third embodiment can be applied to the following embodiments.

However, in the third embodiment, after performing an active operation of a selected word line, an additional time is necessary to increase or decrease potentials of other word lines. The third embodiment has a problem that the bit line capacitance becomes large because capacitance of the cell node is added as bit line capacitance based on the capacitance coupling of a ferroelectric capacitor.

Fourth Embodiment

Figure 5:
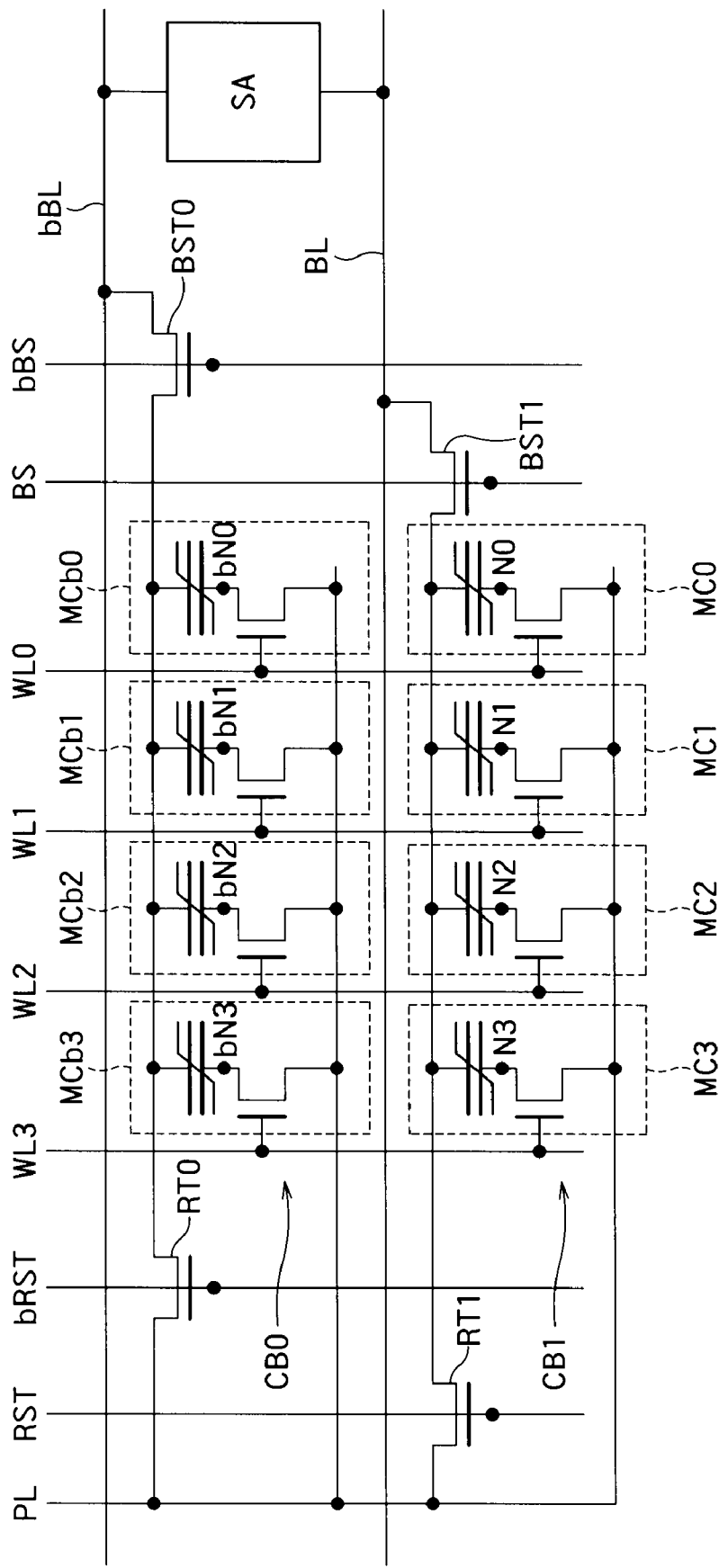
FIG. 5 is a circuit diagram showing a configuration of a ferroelectric memory according to a fourth embodiment of the present invention.

FIG. 5 is a circuit diagram showing a configuration of a ferroelectric memory according to a fourth embodiment of the present invention. The cross section of each memory cell is similar to the cross section shown in FIG. 1B. The ferroelectric memory includes word lines WL0 to WL3, bit lines BL and bBL, plural sub-bit lines SBL and bSBL connected to the bit line BL or bBL, the plate line PL, block selection lines BS and bBS, and reset lines RST and bRST. Reference character b expresses a signal line propagating an inverted signal of , or an inverted signal of ** itself.

A cell block is provided for each sub-bit line. Cell blocks CB0 and CB1 are provided corresponding to the sub-bit lines SBL and bSBL, respectively. The cell blocks CB0 and CB1 include memory cells MC0 to MC3, and memory cells MCb0 to MCb3, respectively. Each of the memory cells MC0 to MC3 and the memory cells MCb0 to MCb3 includes one ferroelectric capacitor and one cell transistor connected in series between the sub-bit line and the plate line. The cell blocks CB0 and CB1 share the word lines WL0 to WL3.

Source terminals of the block selection transistors BST0 and BST1 are connected to the sub-bit lines bSBL and SBL, respectively. Drain terminals of the block selection transistors BST0 and BST1 are connected to the bit lines bBL and BL, respectively. Gates of the block selection transistors BST0 and BST1 are connected to the block selection lines bBS and BS, respectively. Source terminals of reset transistors RT0 and RT1 are connected to the common plate line PL. Source terminals of the reset transistors RT0 and RT1 can be connected to a ground or a power source line instead of the plate line PL. Drain terminals of the reset transistors RT0 and RT1 are connected to the sub-bit lines bSBL and BSL, respectively. Gates of the reset transistors RT0 and RT1 are connected to the reset signal lines bRST and RST, respectively. As explained above, the memory cell blocks CB0 and CB1 include plural memory cells, reset transistors, block selection transistors, and sub-bit lines.

The cell blocks CB0 and CB1 are configured by having plural memory cells connected in parallel. The cell blocks CB0 and CB1 are configured by having the cell blocks CB0 and CB1 arranged in a matrix shape. FIG. 5 shows only the cell blocks CB0 and CB1, for the sake of convenience.

The ferroelectric memory according to the fourth embodiment has a sense amplifier S/A connected between the bit lines bBL and BL, and can detect data of a desired memory cell selected by the bit line and the word line. The sense amplifier S/A can write data into the memory cells by applying a voltage to the memory cells via the bit line or the sub-bit line.

In the fourth embodiment, two kinds of the block selection lines (bBS and BS) are prepared so that two adjacent memory cell arrays can share the sense amplifier S/A, and two kinds of the reset signal lines (bRST and RST) are also prepared. Provision of one kind of the common plate line PL is sufficient. Based on this configuration, as shown in FIG. 1B, the ferroelectric capacitor FC can be provided below the sub-bit line SBL, and the cell transistor CT can be provided below the ferroelectric capacitor FC. As a result, a sub-bit line contact does not need to be provided between the adjacent ferroelectric capacitors. Consequently, a size of each memory cell can be decreased while increasing a formation area of the ferroelectric capacitor FC. When a sub-bit line wiring is present below the ferroelectric capacitor, the sub-bit line wiring is surrounded by the memory cells. Therefore, this generates a problem of an increase of the sub-bit line capacitance. However, the fourth embodiment can restrict the increase of the sub-bit line capacitance.

Figure 6:
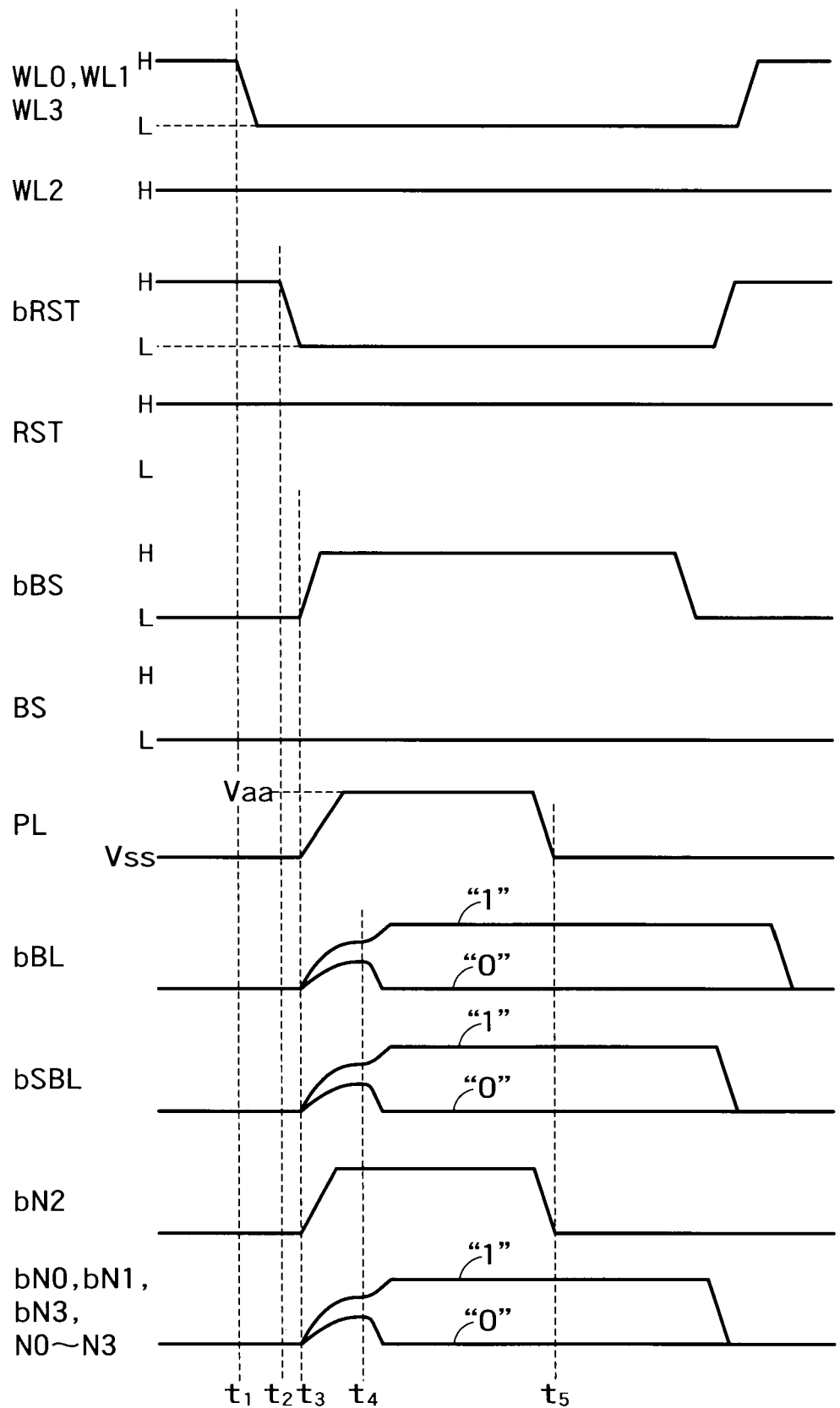
FIG. 6 is a timing diagram showing an operation of the ferroelectric memory according to the fourth embodiment.

FIG. 6 is a timing diagram showing an operation of the ferroelectric memory according to the fourth embodiment. During a standby period before t1, the word lines WL0 to WL3 are all in a logic high state, and the cell transistor CT within the cell block CBi is in the on state. Therefore, the potentials of the cell nodes bN0 to bN3 and N0 to N3 are equal to the potential of the plate line PL. The reset transistor RTi is in the on state during the standby period. Therefore, the potentials of the sub-bit lines bSBL and SBL are equal to the potential of the plate line PL. As a result, potentials of upper electrodes and potentials of lower electrodes of all ferroelectric capacitors within the cell block CBi become equal to the plate line potential, and there is no potential difference between the electrodes of the ferroelectric capacitors. Because all the block selection transistors bBS and BL are in the off state, no current flows between the bit lines bBL and BL and the cell block CB. The standby state is a standby state where the data read operation or the data write operation is not performed. The standby state can be also called a precharge state.

Assume that data stored in a memory cell MCb2 connected to the word line WL2 is read or data is written into the memory cell MCb2 connected to the word line WL2, at an active time of performing the data read operation or the data write operation. In this case, at t1, potentials of only non-selection word lines WL0, WL1, and WL3 are decreased to the logic low state, and cell transistors of non-selection memory cells are set to the off state. The selection word line WL2 maintains the logic high state, and the cell transistors connected to the selection word line WL2 maintain the on state.

At t2, the reset transistor RT0 is set to the off state while maintaining the reset transistor RT1 in the on state. The block selection transistor BST0 is set to the on state while maintaining the block selection transistor BST1 in the off state. The plate line PLL is driven by increasing a potential of the plate line PLL to Vaa in this state. Accordingly, out of the selection cell block CB0, only the cell transistor of the selection memory cell MCb2 is in the on state. Consequently, the potential of the plate line PL is applied to the lower electrode of the ferroelectric capacitor of the selection memory cell MCb, and the potential of the bit line bBL is applied to the upper electrode. Polarization of the ferroelectric capacitor of the selection memory cell MCb2 is inverted based on a potential difference between the plate line PL and the bit line bBL, and data is read out. As shown at t3 to t4, the sense amplifier S/A detects the data (cell charge) via the sub-bit line bSBL and the bit line bBL. At t4, the sense amplifier S/A amplifies this read signal.

When the read data is "0", the data is written back to the ferroelectric capacitor of the selection memory cell MCb2 based on a state that the plate line potential is at the high level potential Vaa. When the read data is "1", the data is written back to the ferroelectric capacitor of the selection memory cell MCb2 based on a state that the plate line potential is at the low level potential Vss. In this series of operation, only one cell transistor is present between the plate line PL and the ferroelectric capacitor of the memory cell MCb2, and only one block selection transistor BST0 is present between the ferroelectric capacitor of the memory cell MCb2 and the bit line bBL. That is, in the fourth embodiment, parasitic capacitance applied to the bit line is small as compared with parasitic capacitance applied to the bit line of a conventional plural-cell series ferroelectric memory. Therefore, any operation delay does not occur, and a high-speed read operation and a high-speed write operation can be achieved.

Further, because the memory cells are connected to the bit line in the cell block CBi unit, the number of contacts between the bit line and the sub-bit line can be decreased. The small number of contacts leads to a decrease of the bit line capacitance. Because the memory cells are connected to the bit line in the cell block CBi unit, many memory cells can be connected to one bit line. Accordingly, an area occupied by the sense amplifier can be decreased, and signals on the bit line can be increased. When a memory cell is arranged at each intersection between the bit line and the word line, small memory cells of about $6F^2$ can be achieved. F (feature size) is a minimum line width that can be formed using lithography in a certain generation.

The non-selection memory cells MCb0, MCb1, and MCb3 within the selection cell block CB0 are capacitance coupled with the sub-bit line bSBL. Therefore, based on the operation of the sub-bit line bSBL, potentials of the upper electrodes of the ferroelectric capacitors within the memory cells MCb0, MCb1, and MCb3 oscillate. However, because the cell transistors within the memory cells MCb0, MCb1, and MCb3 are in the off state, data is not read from the memory cells MCb0, MCb1, and MCb3.

Because the reset transistor RT1 is kept in the on state, and also because the block selection transistor is kept in the off state, data is not read from the memory cells MC0 to MC3 within the non-selection cell block CB1 connected to the bit line BL. When reference potential Vref is transmitted to the bit line BL using a separate circuit, the memory cells can be operated as 1T-1C type memory cells. That is, in the fourth embodiment, one-cell/bit memory capable of storing one-bit data in one memory cell MC can be achieved.

When the word line WL2 is selected, because the cell transistor within the memory cell MC2 is in the on state, potentials of both electrodes of the ferroelectric capacitor within the memory cell MC2 become equal to the potential of the plate line PL. Consequently, a problem of disturbance does not occur at the active time.

Potentials of the cell nodes N0, N1, and N3 are set to the same as the plate potential during a standby period. Therefore, potentials of both electrodes of the ferroelectric capacitors of the memory cells MC0, MC1, and MC3 are the same. Even when the cell transistors of the memory cells MC0, MC1, and MC3 become in the off state during the read or write operation, the potential of the sub-bit line SBL becomes equal to the plate line potential because the reset transistor RT1 is in the on state. Therefore, when the plate line potential operates in the order of low, high, and low, potentials of the cell nodes N0, N1, and N3 operate in the order of low, high, and low based on a capacitance coupling of the ferroelectric capacitor with the sub-bit line SBL. Consequently, potentials of the cell nodes N0, N1, and N3 do not oscillate in the amplitude of the sub-bit line SBL or above. As a result, deterioration of reliability of the memory cell can be restricted without applying a sequential bias to the PN junction between the drain and the well (the substrate).

When a select operation of the word line WL2 is repeated, the cell nodes N0, N1, and N3 repeatedly oscillate between low and high, and the high level potentials of the cell nodes N0, N1, and N3 have a risk of being decreased due to a PN junction leak. However, the activation time of the selection word line is limited (10 μs, for example), and the reset transistor RTi and the cell transistor become in the on state during the standby period after the read or write operation. Accordingly, the potentials of the cell nodes N0, N1, and N3 are reset to Vss, and the decrease of the high level potentials of the cell nodes N0, N1, and N3 does not become a problem.

In the selection cell block CB0 connected to the bit line bBL, potentials of both electrodes of the ferroelectric capacitors of the memory cells MC0, MC1, and MC3 are set to the same level during the standby period. Therefore, even when the potential of the sub-bit line SBL varies between Vss and Vaa in the read operation or the write operation, the potentials of the cell nodes bN0, bN1, and bN3 operate only between Vss and Vaa in the same manner as the sub-bit line SBL, and do not oscillate in the amplitude of the sub-bit line or in a larger amplitude. As a result, deterioration of reliability of the memory cells can be restricted without applying a forward bias to the PN junction between the drain and the well (the substrate).

When a select operation of the word line WL2 is repeated, the cell nodes bN0, bN1, and bN3 repeatedly oscillate between low and high, and the high level potentials of the cell nodes bN0, bN1, and bN3 have a risk of being decreased due to a PN junction leak. However, because the cell nodes bN0, bN1, and bN3 are also reset to Vss during a standby period, decrease of the high level potentials of the cell nodes bN0, bN1, and bN3 does not become a problem.

As explained above, because disturbance of the non-selection memory cell can be avoided, all memory cells of the cell block can share the plate line PL. Accordingly, delayed driving of the plate line PL can be restricted, the area of the plate line driving circuit can be decreased, and the plate line driving capacity can be improved.

According to the fourth embodiment, the following effects can be obtained by solving problems of conventional ferroelectric memories and conventional CCB cells (capacitance-coupled bit line cells).

1. Because a sub-bit line contact or a bit line contact is not present between adjacent ferroelectric capacitors, a cell size can be decreased while increasing a capacitor size.

2. Because a hierarchical bit line configuration is employed, addition of parasitic capacitance of a cell node to the bit line capacitance can be restricted even when the CCB cell is employed.

3. A problem of disturbance can be restricted by restricting the oscillation of potential of the cell node in the amplitude of the potential of the bit line or in a larger amplitude.

4. All memory cells within the memory cell block can share the plate line. The number of plate driving circuits can be decreased by driving the plate line at high speed.

5. Because cell transistors are not connected in series, addition of the parasitic capacitance of the cell transistor to the bit line capacitance can be restricted.

6. A sub-bit line does not need to be formed below the ferroelectric capacitor. A high resistance wiring is not necessary as a wiring of the sub-bit line, and a memory can be applied to a logic embedded memory. Manufacturing cost can be decreased.

Fifth Embodiment

Figure 7:
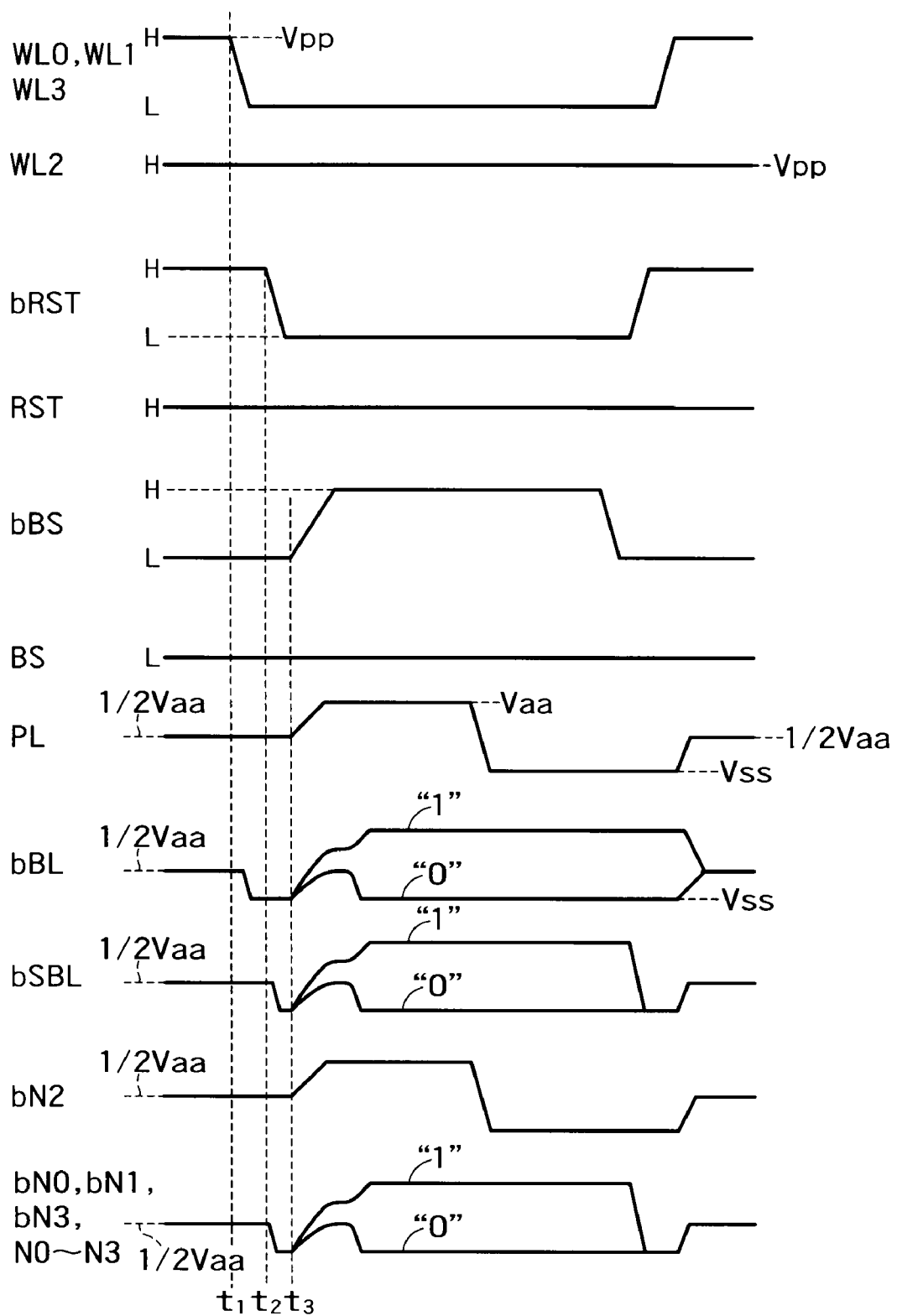
FIG. 7 is a timing diagram showing an operation of a ferroelectric memory according to a fifth embodiment of the present invention.

FIG. 7 is a timing diagram showing an operation of a ferroelectric memory according to a fifth embodiment of the present invention. Unlike the operation of the fourth embodiment shown in FIG. 6, during a standby period, a plate line potential, a cell node potential, and potentials of a bit line and a sub-bit line are precharged to ½ Vaa. Accordingly, even when a word line potential during the standby period is a high level potential Vpp, a potential difference between the word line WL and a source S of the cell transistor and a potential difference between the word line WL and a drain D of the cell transistor become Vpp–½ Vaa. Because Vpp–½Vaa is smaller than Vpp–Vss, the reliability of the memory cells improves.

Even when the plate line potential, the cell node potential, and the potentials of the bit line and the sub-bit line are Vaa during the standby period, data in the ferroelectric capacitor is not broken because a difference of potentials applied to both electrodes of the ferroelectric capacitor is ½ Vaa.

In the write or read operation, a detect operation is started after the bit line potential is set to Vss. Accordingly, a potential difference between the plate line and the bit line becomes Vaa, and a polarization inversion occurs. As a result, the sense amplifier S/A can detect data.

Other operations of the fifth embodiment are identical to those of the fourth embodiment. The fifth embodiment can achieve effects identical to those of the fourth embodiment.

Sixth Embodiment

Figure 8:
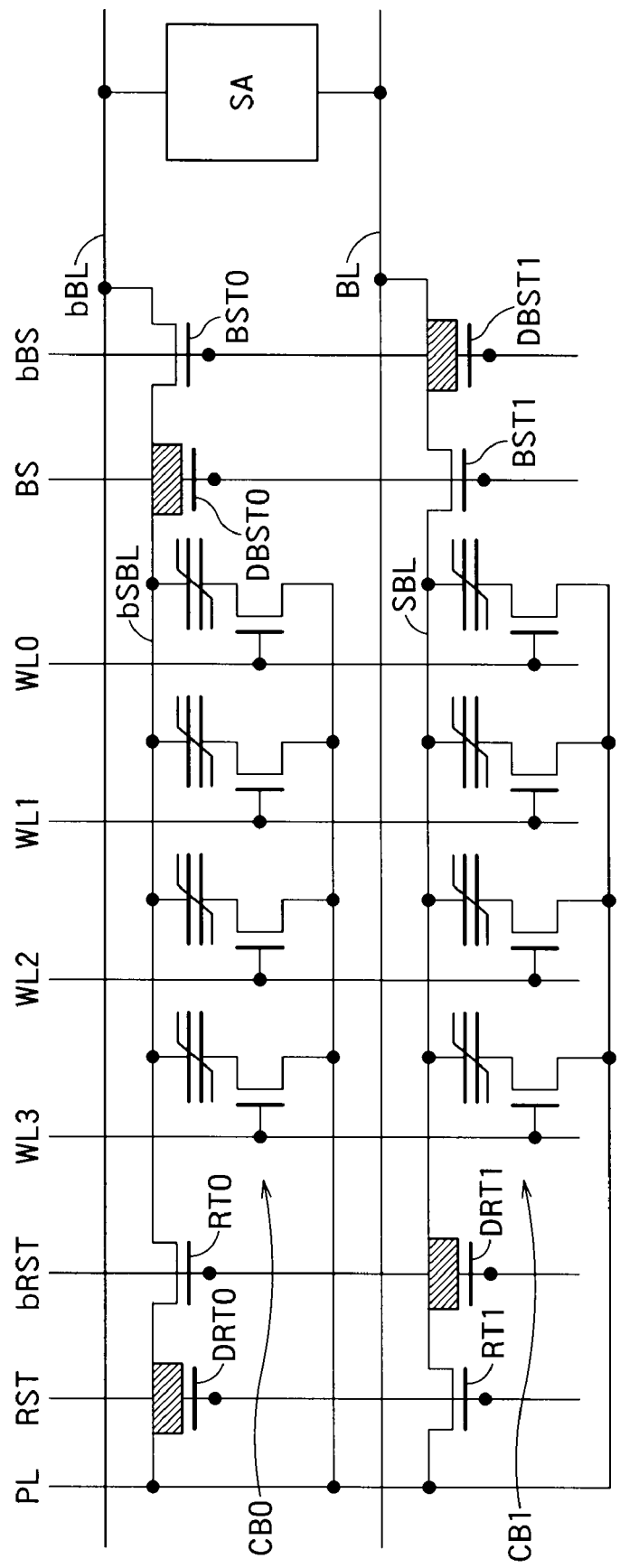
FIG. 8 is a circuit diagram showing a configuration of a ferroelectric memory according to a sixth embodiment of the present invention.

FIG. 8 is a circuit diagram showing a configuration of a ferroelectric memory according to a sixth embodiment of the present invention. In the sixth embodiment, the ferroelectric memory includes a depletion transistor DBST0 provided between the block selection transistor BST0 and the sub-bit line bSBL and having a gate connected to the block selection line BS, and a depletion transistor DBST1 provided between the block selection transistor BST1 and the bit line BL and having a gate connected to the block selection line bBS. The depletion transistor DBST0 is provided to maintain a connection between the sub-bit line bSBL and the block selection transistor BST0 even when the block selection line BS is in a non-selection state. The depletion transistor DBST1 is provided to maintain a connection between the sub-bit line SBL and the block selection transistor BST1 even when the block selection line bBS is in a non-selection state.

In the sixth embodiment, the ferroelectric memory includes a depletion transistor DRT0 provided between the reset transistor RT0 and the plate line PL and having a gate connected to the reset line RST, and a depletion transistor DRT1 provided between the reset transistor RT1 and the sub-bit line SBL and having a gate connected to the reset line bRST. The depletion transistor DRT0 is provided to maintain a connection between the plate line PL and the reset transistor RT0 even when the reset line RST is in a non-selection state. The depletion transistor DRT1 is provided to maintain a connection between the sub-bit line SBL and the reset transistor RT1 even when the reset line bRST is in a non-selection state.

A depletion transistor has a negative threshold voltage based on a channel ion implantation. Therefore, the depletion transistors DBST0 and DBST1 are provided so as not to electrically disconnect the sub-bit line even when the gate electrodes (the block selection lines BS and bBS) of the two kinds of block selection transistors are crossed with the diffusion layers below the block selection lines BS and bBS. The depletion transistors DRT0 and DRT1 are provided so as not to electrically disconnect the sub-bit line even when the gate electrodes (the reset lines RST and bRST) of the two kinds of reset transistors are crossed with the diffusion layers below the reset lines RST and bRST.

The equivalent circuit of the sixth embodiment is identical to that of the fourth embodiment. Therefore, the sixth embodiment can achieve effects identical to those of the fourth embodiment.

Figure 9:
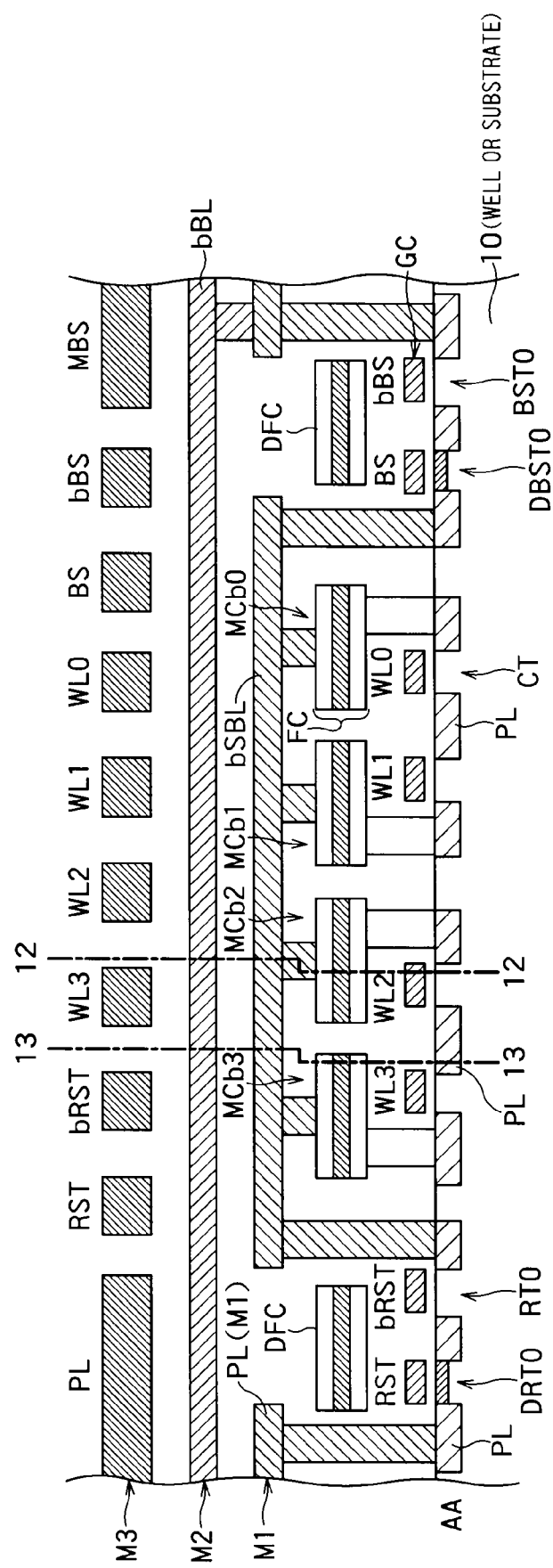
FIG. 9 is a cross-sectional view of the ferroelectric memory along an extending direction of the bit line of the cell block CB0 according to the sixth embodiment.
Figure 10:
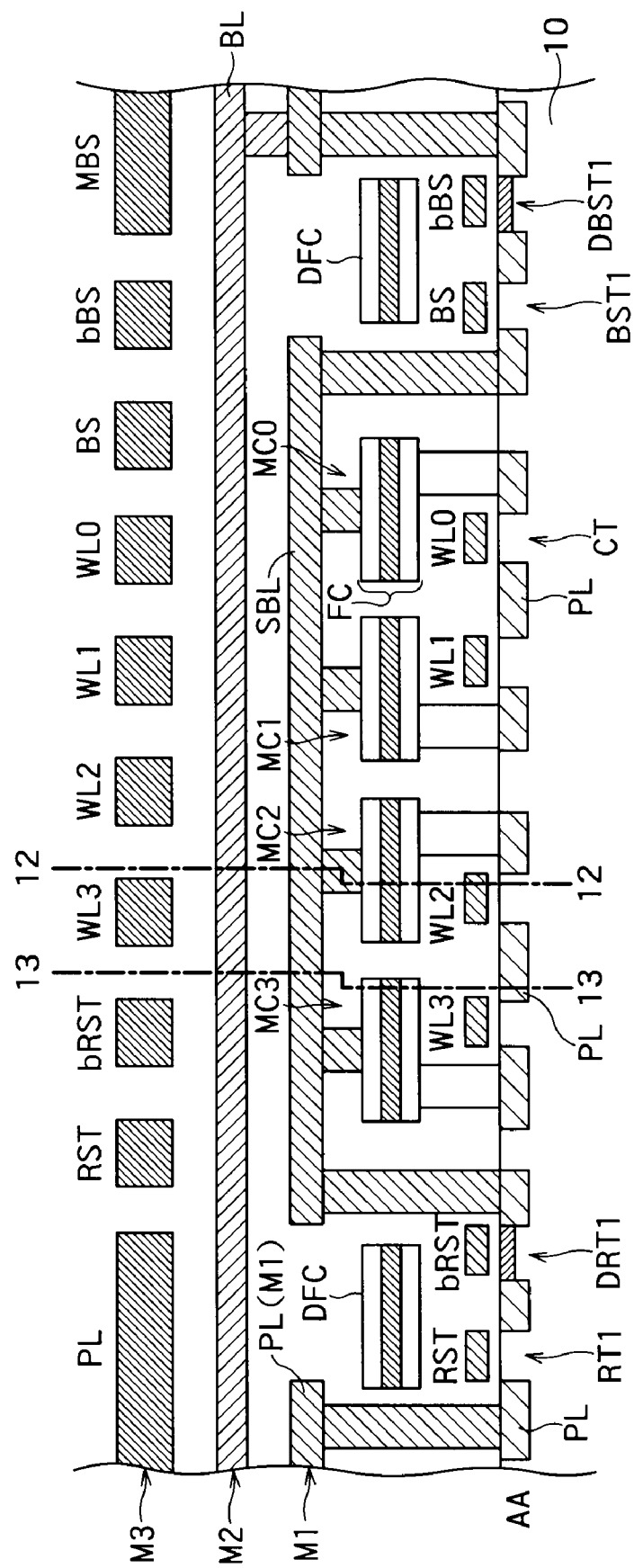
FIG. 10 is a cross-sectional view of the ferroelectric memory along an extending direction of the bit line of the cell block CB1 according to the sixth embodiment.
Figure 11:
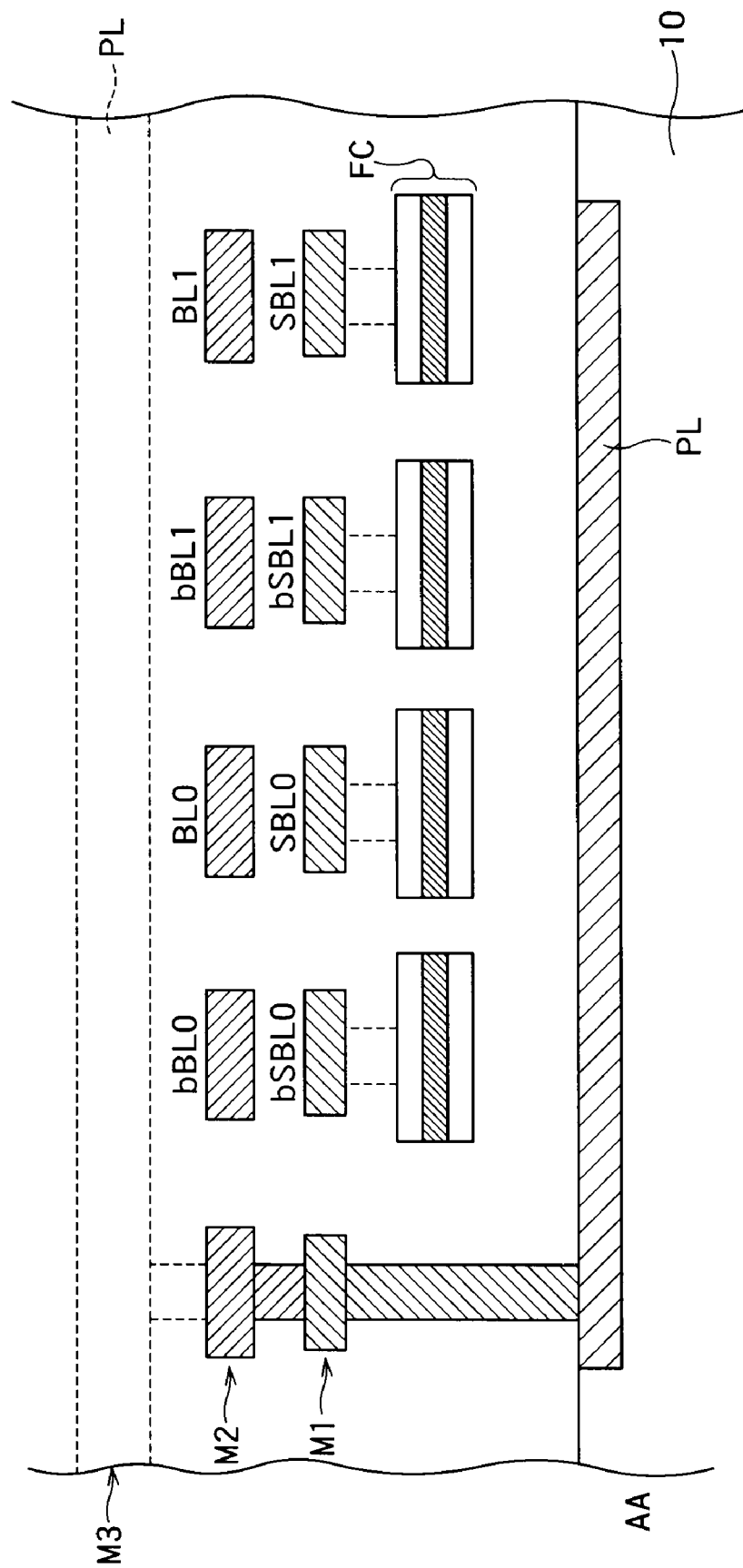
FIG. 11 is a cross-sectional view along a line 12-12 (along the word line WL2) in FIG. 9 and FIG. 10.
Figure 12:
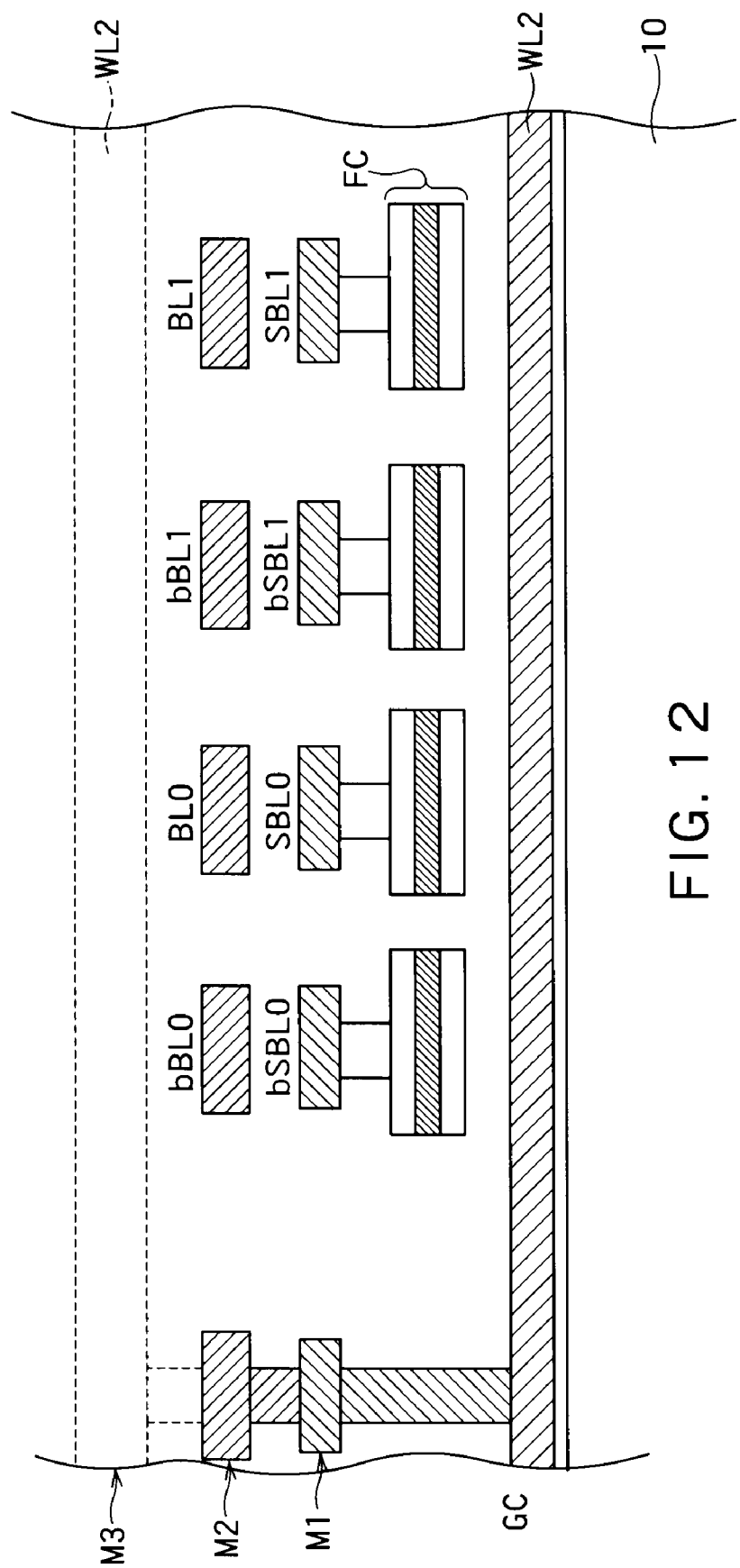
FIG. 12 is a cross-sectional view along a line 13-13 (along the plate line PL) in FIG. 9 and FIG. 10.

FIG. 9 is a cross-sectional view of the ferroelectric memory along an extending direction of the bit line of the cell block CB0 according to the sixth embodiment. FIG. 10 is a cross-sectional view of the ferroelectric memory along an extending direction of the bit line of the cell block CB1 according to the sixth embodiment. FIG. 11 is a cross-sectional view along a line 12-12 (along the word line WL2) in FIG. 9 and FIG. 10. FIG. 12 is a cross-sectional view along a line 13-13 (along the plate line PL) in FIG. 9 and FIG. 10.

As is clear from a comparison between FIG. 9 and FIG. 10, the cell blocks CB0 and CB1 are different in positional relationships between the depletion transistors DBST0, DBST1, DRT0, and DRT1, the block selection transistors BST0 and BST1, and the reset transistors RT0 and RT1.

The sub-bit lines bSBL and SBL are formed by first metal layers M1 deposited above the ferroelectric capacitor FC. The bit lines bBL and BL are formed by second metal layers M2 deposited above the first metal layers M1. The word line WLi, the plate line PL, the reset lines bRST and RST, the block selection lines bBS and BS, and a main-block selection line MBS are formed by third metal layers M3 deposited above the second metal layers M2. With this arrangement, wiring resistance of the word line WLi, the plate line PL, the reset lines bRST and RST, the block selection lines bBS and BS, and the main-block selection line MBS can be decreased.

A drain of the cell transistor is connected to a lower electrode of the ferroelectric capacitor by a contact between the well or the substrate 10 and the lower electrode of the ferroelectric capacitor. The plate line PL is formed by a source diffusion layer of the cell transistor CT. The plate line PL formed by the source diffusion layer is arranged in an extending direction of the word line. Even when silicide (WSi, CoSi, and NiSi, for example) is provided in the source diffusion layer, the plate line PL driving the ferroelectric capacitor has relatively high resistance. As shown in FIG. 9 and FIG. 10, for example, the plate lines PL including diffusion layers are provided at each distance of a constant number of memory cells arranged in an extending direction of the bit line. Further, the plate lines PL formed by the third metal layers M3 using a low resistance metal shown by a broken line in FIG. 11 can be provided at each distance of a constant number of memory cells arranged in an extending direction of the bit line. For example, both or either one of the plate line PL including a diffusion layer and the plate line PL formed by the third metal layers M3 can be provided at each 32 memory cells, 64 memory cells, 128 memory cells, or 256 memory cells. Accordingly, wiring resistance of the plate line PL including the source diffusion layer can be decreased. The word line WLi, the block selection lines bBS and BS, and the reset lines bRST and RST can be also connected to a low resistance wiring formed at a constant interval of the third metal layers M3, in a similar manner to that of the plate line PL. Accordingly, wiring resistance of the word line WLi, the block selection lines bBS and BS, and the reset lines bRST and RST can be decreased.

As shown in FIG. 9 and FIG. 10, a sub-bit line contact is not provided between adjacent ferroelectric capacitors of the memory cells MC1 and MCbi, respectively. Accordingly, an area of the ferroelectric capacitor FC can be increased, and a size of each memory cell can be decreased.

A metal bridge including the first metal layers M1 does not need to be formed above the block selection lines bBS and BS and the reset lines bRST and RST, by introducing the depletion transistors DBST0, DBST1, DRT0, and DRT1. Accordingly, a dummy ferroelectric capacitor DFC can be arranged above the block selection lines bBS and BS and the reset lines bRST and RST.

FIG. 13 to FIG. 16 are plane layout diagrams of the memory cell MC. A configuration of the memory cell MC can be applied to the memory cells MC in the first embodiment to a ninth embodiment of the present invention.

Figure 13:
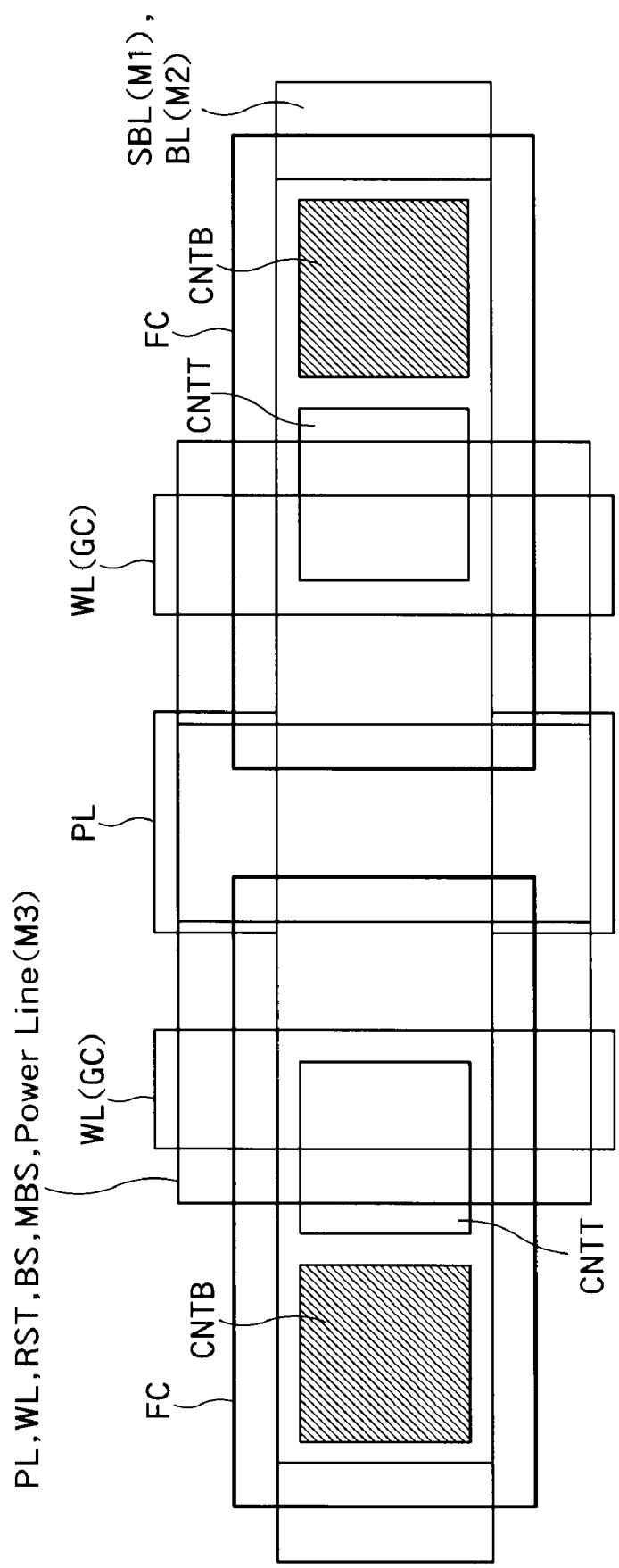
FIG. 13 to FIG. 16 are plane layout diagrams of the memory cell MC.
Figure 14:
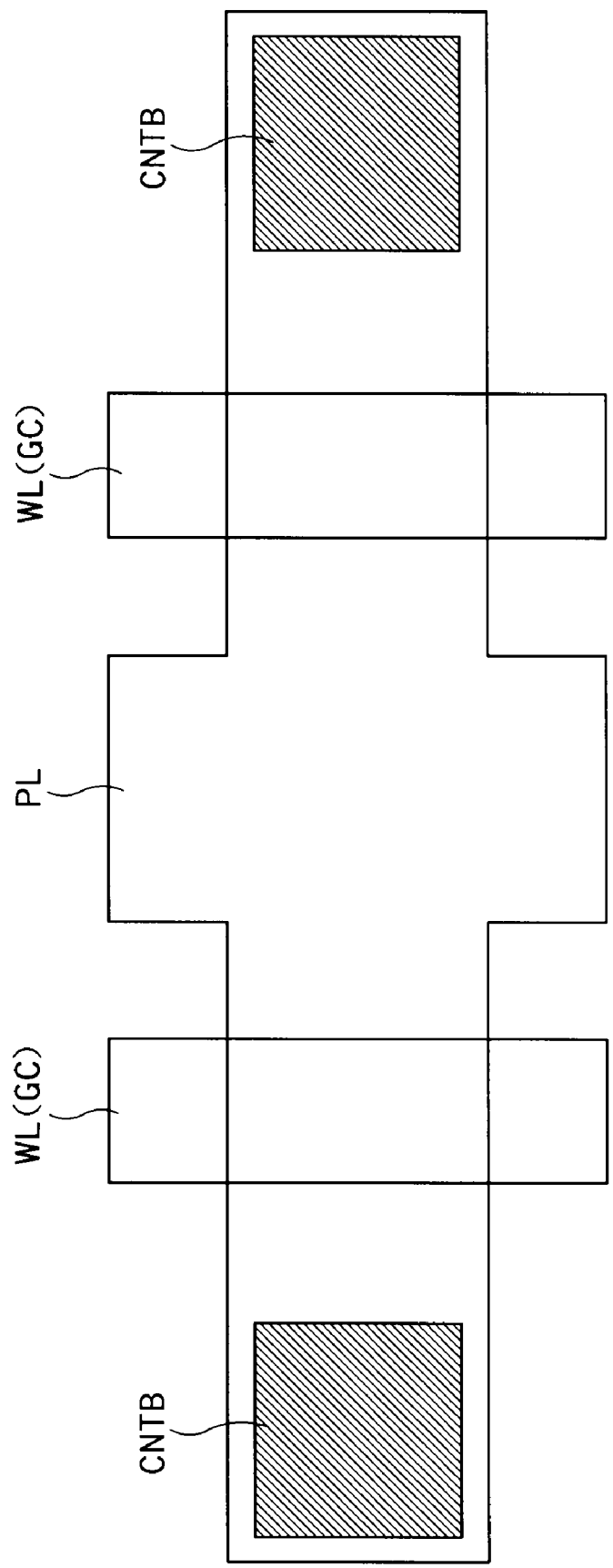
Figure 15:
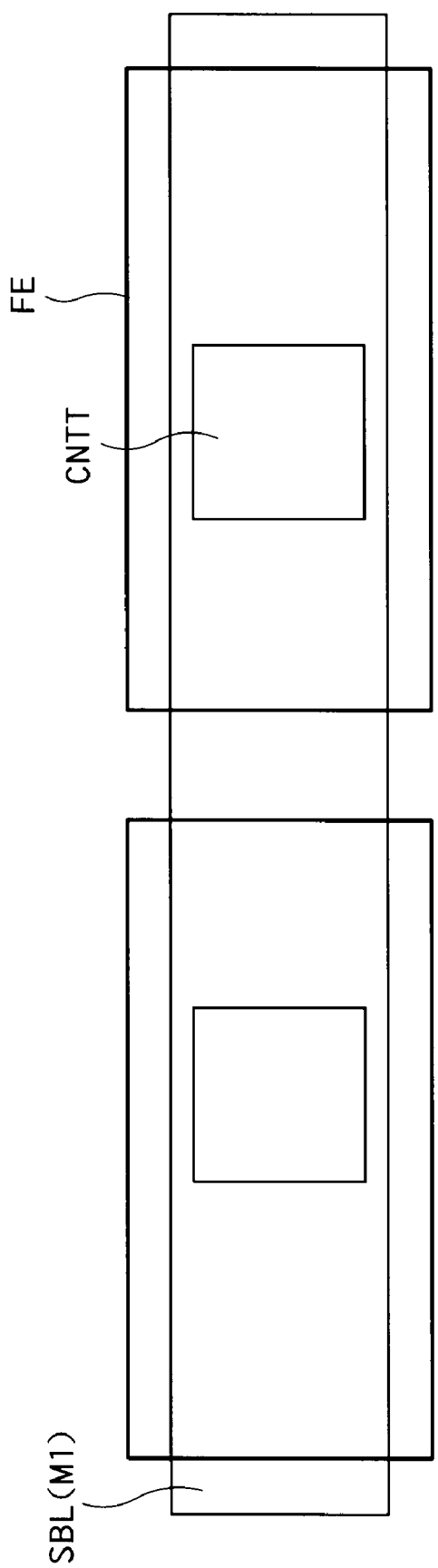
Figure 16:
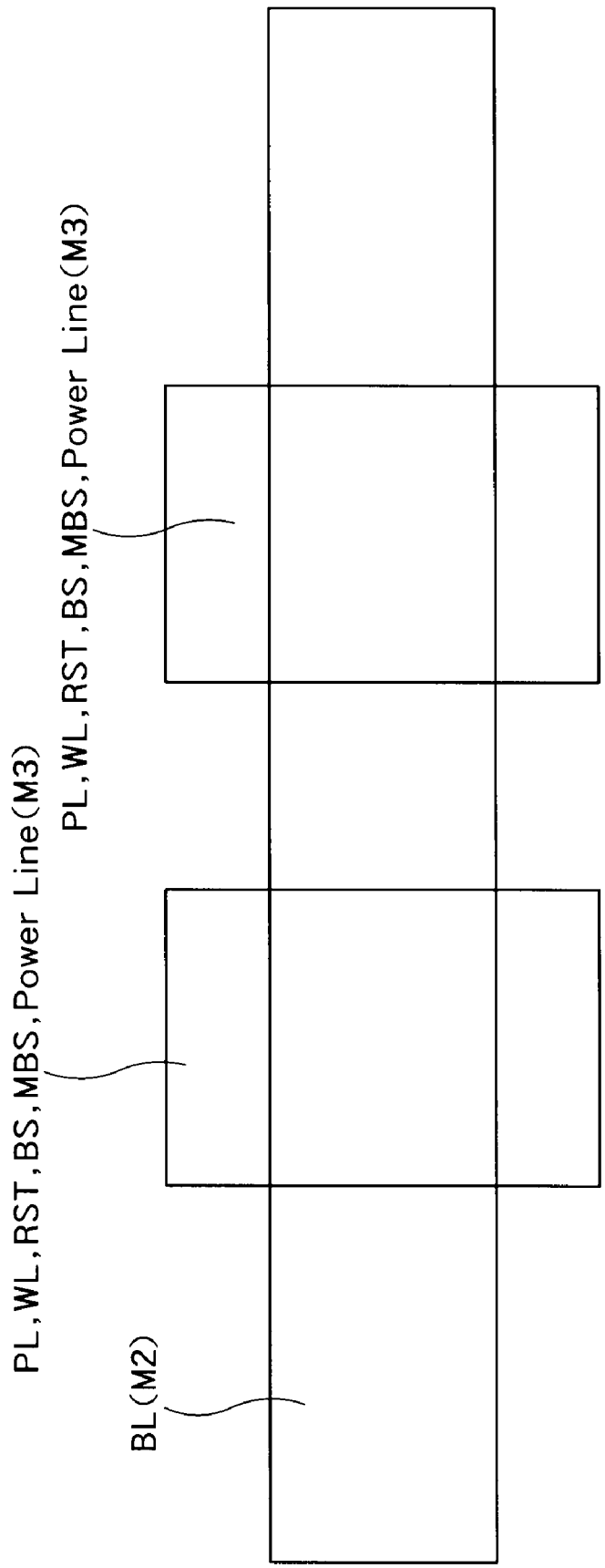

FIG. 13 is a layout diagram showing the word line WL (a gate wiring GC), the plate line PL (a diffusion layer wiring), a lower electrode contact CNTB, an upper electrode contact CNTT, the ferroelectric capacitor FC, the sub-bit line (M1), and the bit line (M2). FIG. 14 shows the word line WL (the gate wiring GC), the plate line PL (the diffusion layer wiring), and the lower electrode contact CNTB, among layers shown in FIG. 13. FIG. 15 shows the bit line (M2), and other wiring (M3).

Because there is no sub-bit line contact between the adjacent ferroelectric capacitors FC, a distance between the ferroelectric capacitors FC can be formed small as shown in FIG. 13 and FIG. 15. Therefore, the area of the ferroelectric capacitors can be increased while decreasing the cell size.

Seventh Embodiment

Figure 17:
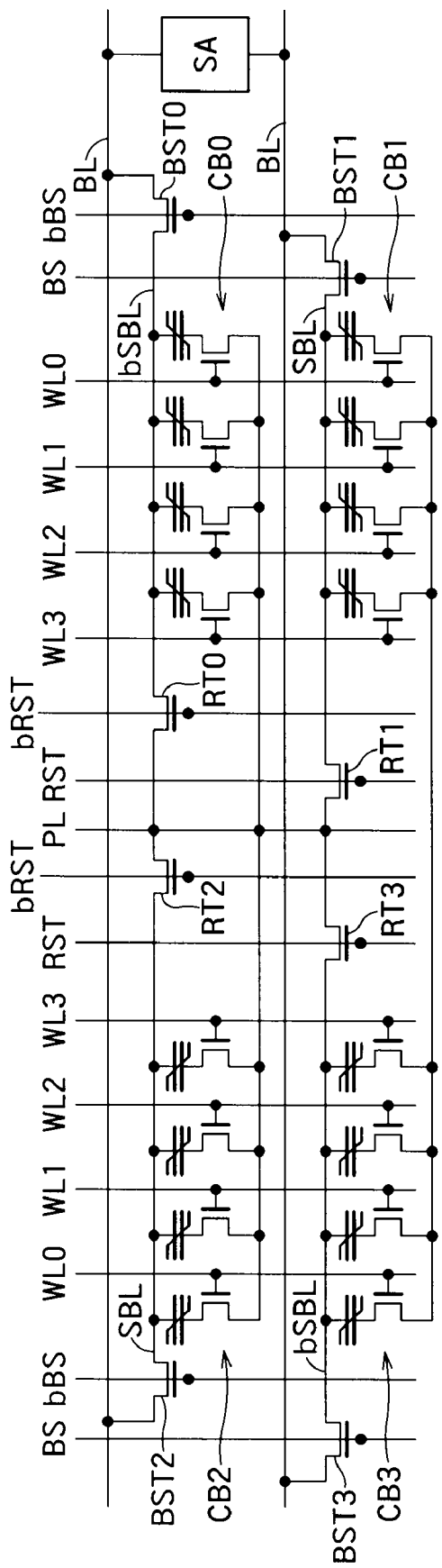
FIG. 17 is a circuit diagram showing a configuration of a ferroelectric memory according to a seventh embodiment of the present invention.

FIG. 17 is a circuit diagram showing a configuration of a ferroelectric memory according to a seventh embodiment of the present invention. The seventh embodiment is different from the fourth embodiment in that two cell blocks out of the cell blocks CB0 to CB3 adjacent in an extending direction of the bit line share one plate line PL. Other configurations of the seventh embodiment are identical to those of the fourth embodiment.

For example, assume that CB0 is a first memory cell block and CB2 is a second memory cell block. CB0 and CB2 are adjacent in a bit line direction. In the first memory cell block CB0, a source of the cell transistor CT is connected to a common plate line PL. An upper electrode of the ferroelectric capacitor FC is connected to a first sub-bit line bSBL. A source of a first reset transistor RT0 is connected to the common plate line PL (or a fixed potential shown in FIGS. 40 and 41). A drain of the first reset transistor RT0 is connected to the first sub-bit line bSBL. A source of a first block selection transistor BST0 is connected to the first sub-bit line bSBL. A drain of the first block selection transistor BST0 is connected to the bit line BL.

In the second memory cell block CB2, a source of the cell transistor CT is connected to the common plate line PL. An upper electrode of the ferroelectric capacitor FC is connected to a second sub-bit line SBL. A source of a second reset transistor RT2 is connected to the common plate line PL (or the fixed potential shown in FIGS. 40 and 41). A drain of the second reset transistor RT2 is connected to the second sub-bit line SBL. A source of a second block selection transistor BST2 is connected to the second sub-bit line SBL. A drain of the second block selection transistor BST2 is connected to the same bit line BL as that to which the drain of BST0 is connected.

When plural adjacent cell blocks share one plate line PL, resistance of the plate line PL substantially decreases. As a result, the number of plate driving circuits can be further decreased. The seventh embodiment can be applied to the above and the following embodiments as well as to the fourth embodiment.

Eighth Embodiment

FIG. 18 to FIG. 22 are plane layout diagrams of a ferroelectric memory according to an eighth embodiment of the present invention. The eighth embodiment is a combination of the sixth and seventh embodiments. Therefore, cell blocks having depletion transistors and adjacent in an extending direction of a bit line share a plate line. The plate line PL, the block selection lines bBS and BS, the reset lines bRST and RST, and the word line WLi are connected to the wiring of the third metal layers M3 at a constant interval of each constant number cells. PL (M3), bBS (M3), BS (M3), bRST (M3), RST (M3), and WLi (M3) show the third metal layers connected to the word lines WLi.

The bit lines bBLi and BLi are formed by the second metal layers M2. The sub-bit lines bSBL and SBL are formed by the first metal layers M1 below the bit lines bBL1 and BLi.

Figure 18:
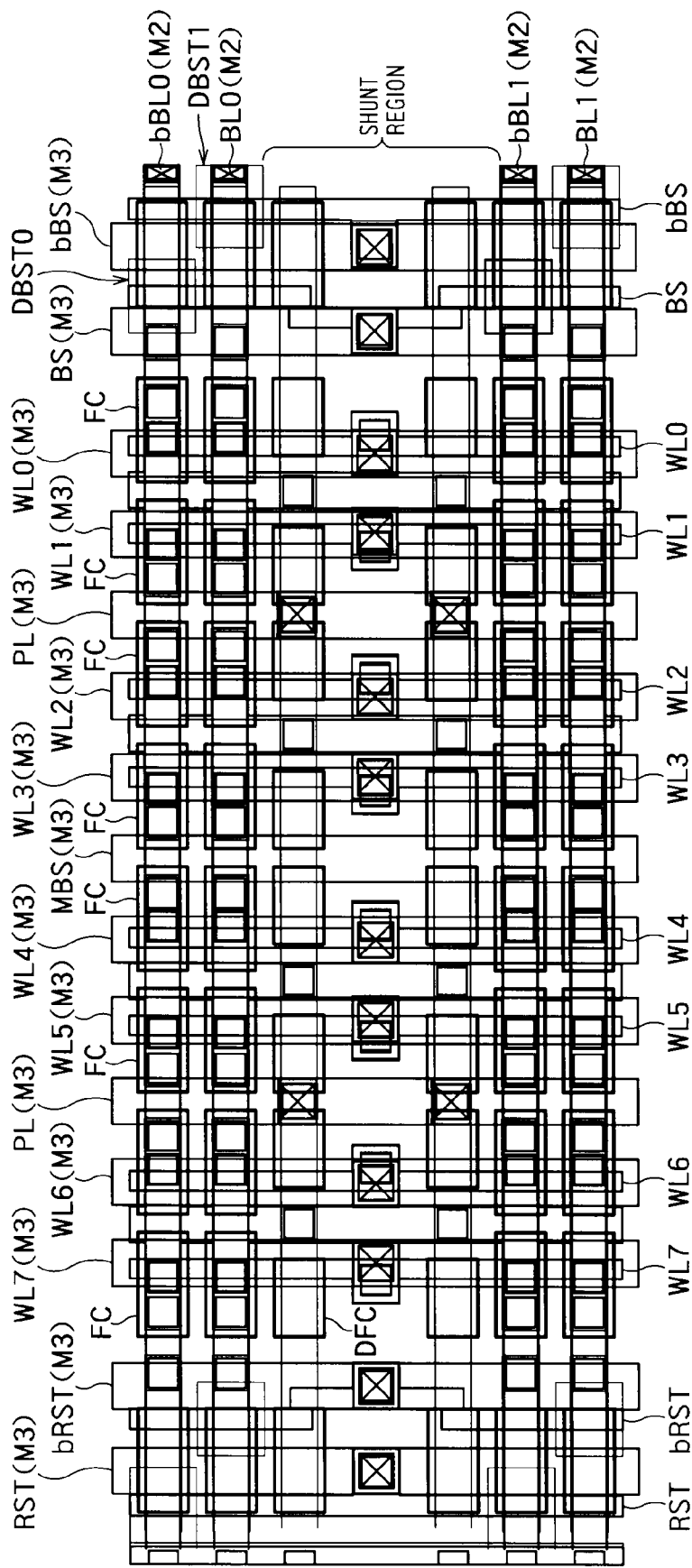
FIG. 18 to FIG. 22 are plane layout diagrams of a ferroelectric memory according to an eighth embodiment of the present invention.
Figure 19:
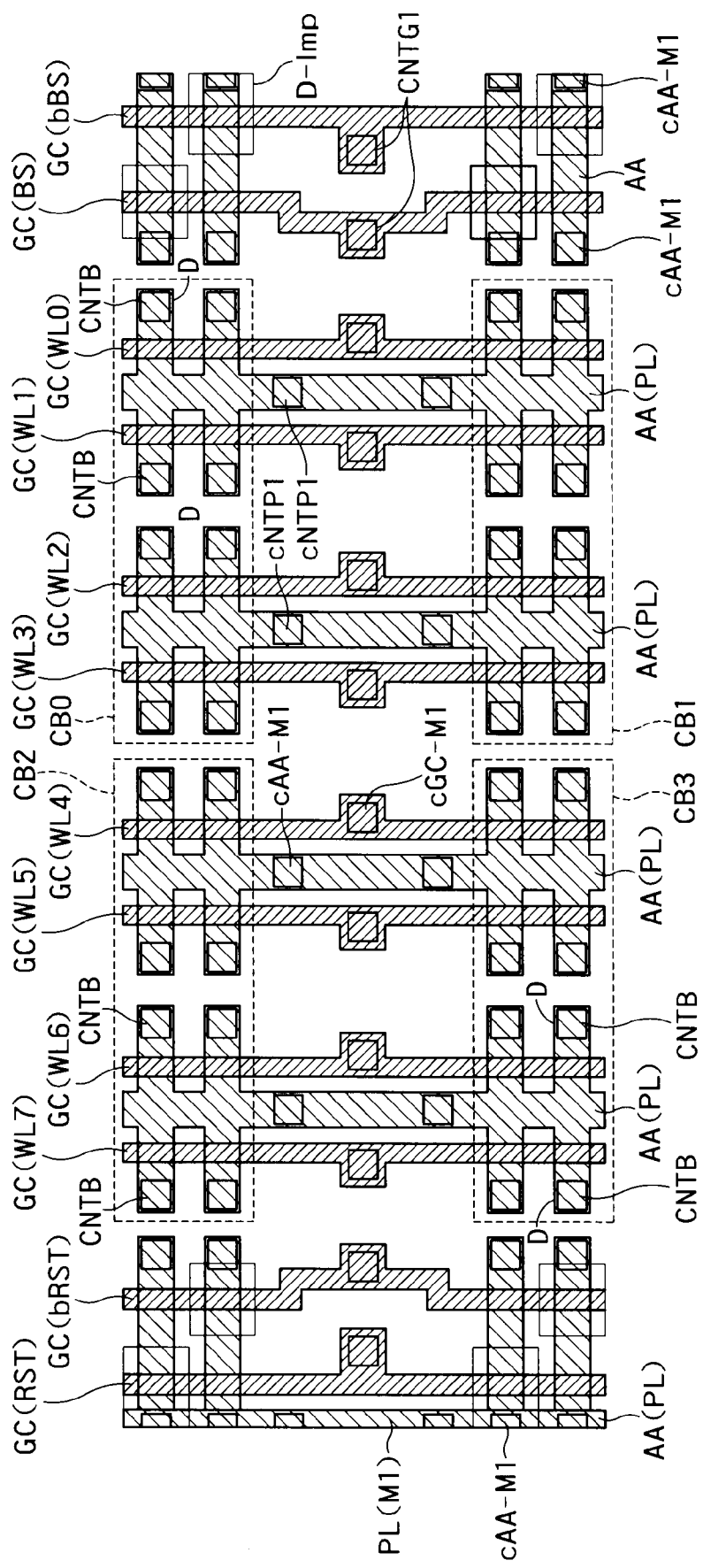

FIG. 19 to FIG. 22 are top plan views showing the layout of FIG. 18 divided into layers to facilitate the understanding. FIG. 19 shows a layout of gate wirings of cell transistors, block selection transistors, and reset transistors, a layout of the plate line PL formed by a diffusion layer, and a layout of channel implantation masks D-Imp of depletion transistors. CNTB denotes a lower-electrode contact connecting between the drain layer D and a lower electrode of the ferroelectric capacitor FC. Reference character cGC-M1 denotes a contact from the gate wirings of the cell transistor, the block selection transistor, and the reset transistor to the first metal layers M1. Reference character cAA-M1 denotes a contact between a source or drain layer of the block selection transistor and the first metal layer M1, a contact between a source or drain layer of the reset transistor and the first metal layer M1, and a contact between a diffusion layer of the plate line PL and the first metal layer.

Figure 20:
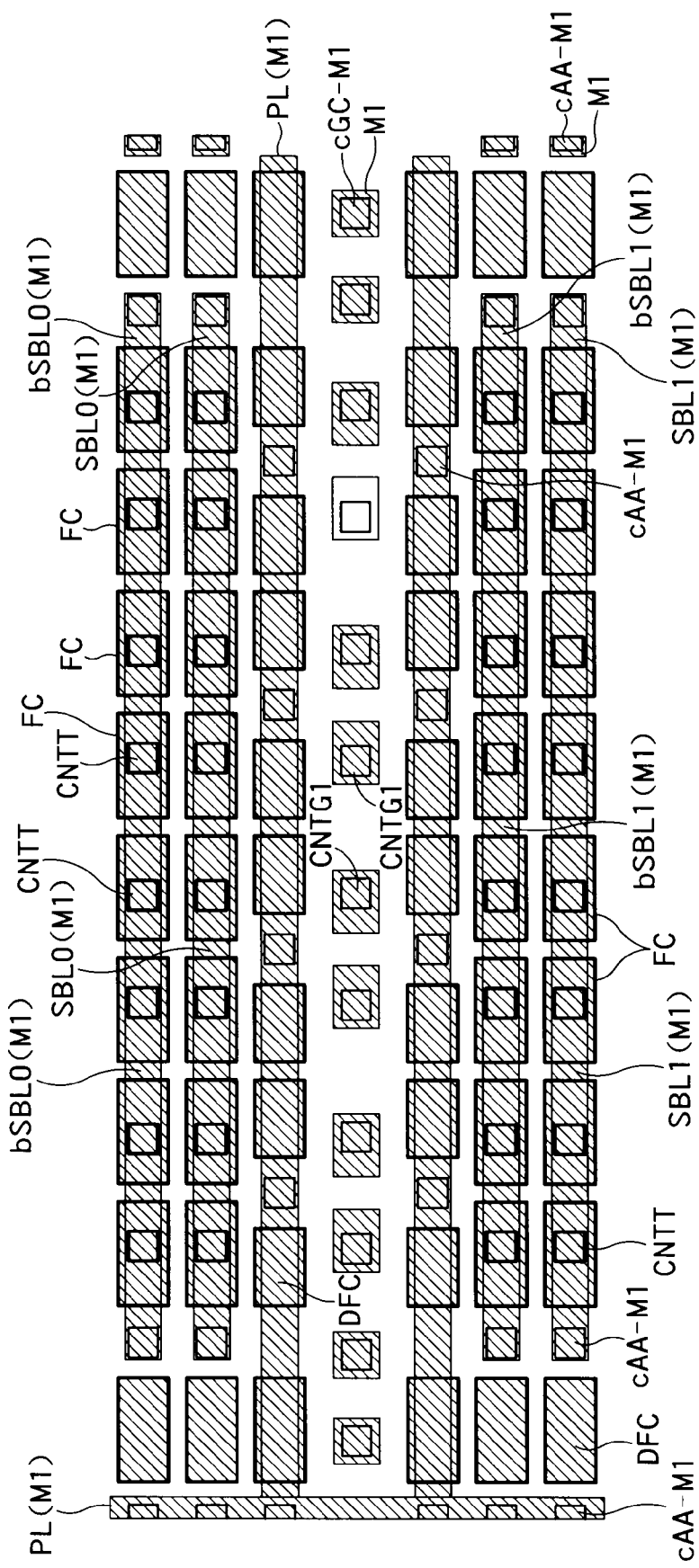

FIG. 20 shows mainly a layout of the first metal layer M1. More specifically, FIG. 20 shows a layout of the ferroelectric capacitor FC, a layout of the bit lines bSBL and SBL formed by the first metal layers M1, a layout of the plate line PL, and a layout of the electrode contact CNTT between an upper electrode of the ferroelectric capacitor FC and a sub-bit line.

Figure 21:
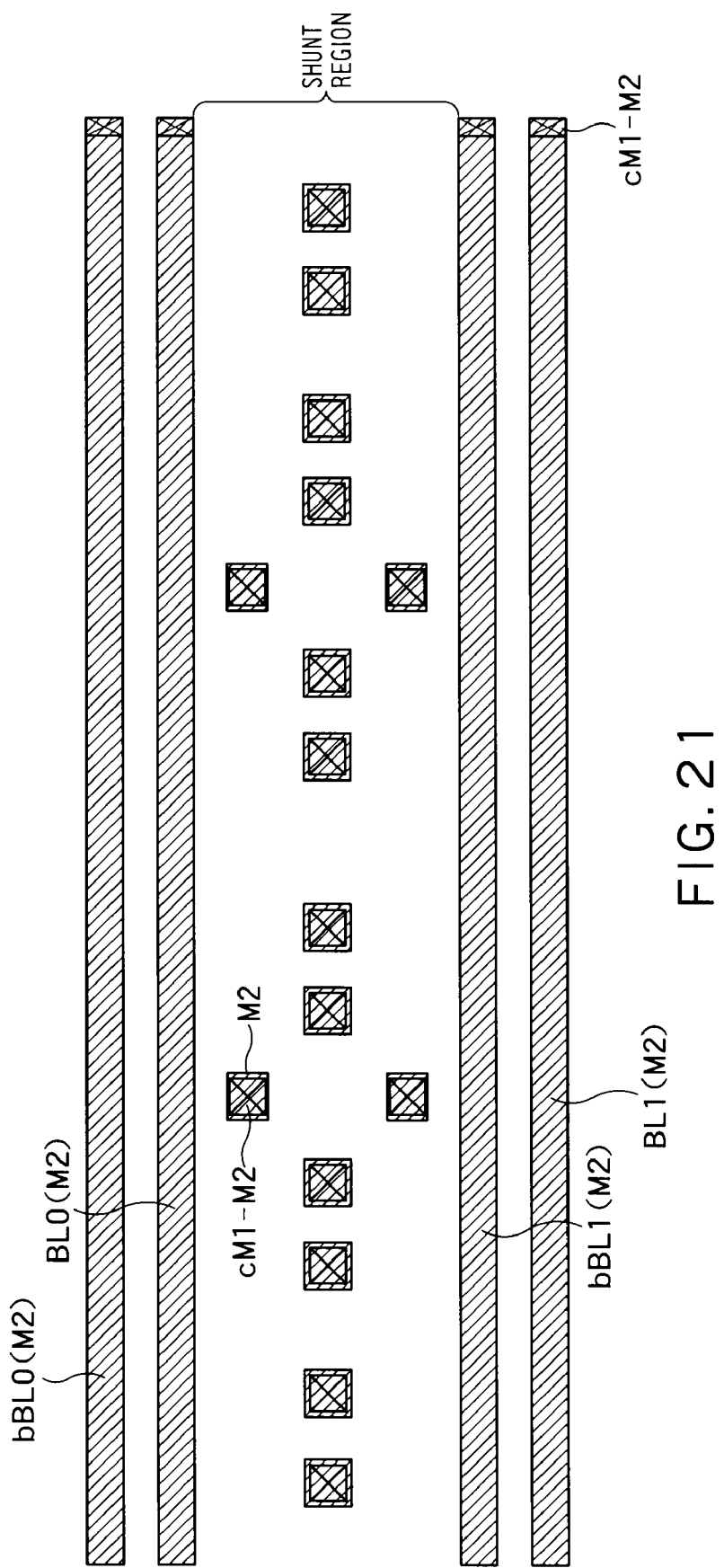

FIG. 21 shows mainly a layout of the second metal layers M2. More specifically, FIG. 21 shows a layout of the bit lines bBL and BL formed by the second metal layers M2, and a layout of a contact cM1-M2 between the first metal layer M1 and the second metal layer M2.

Figure 22:
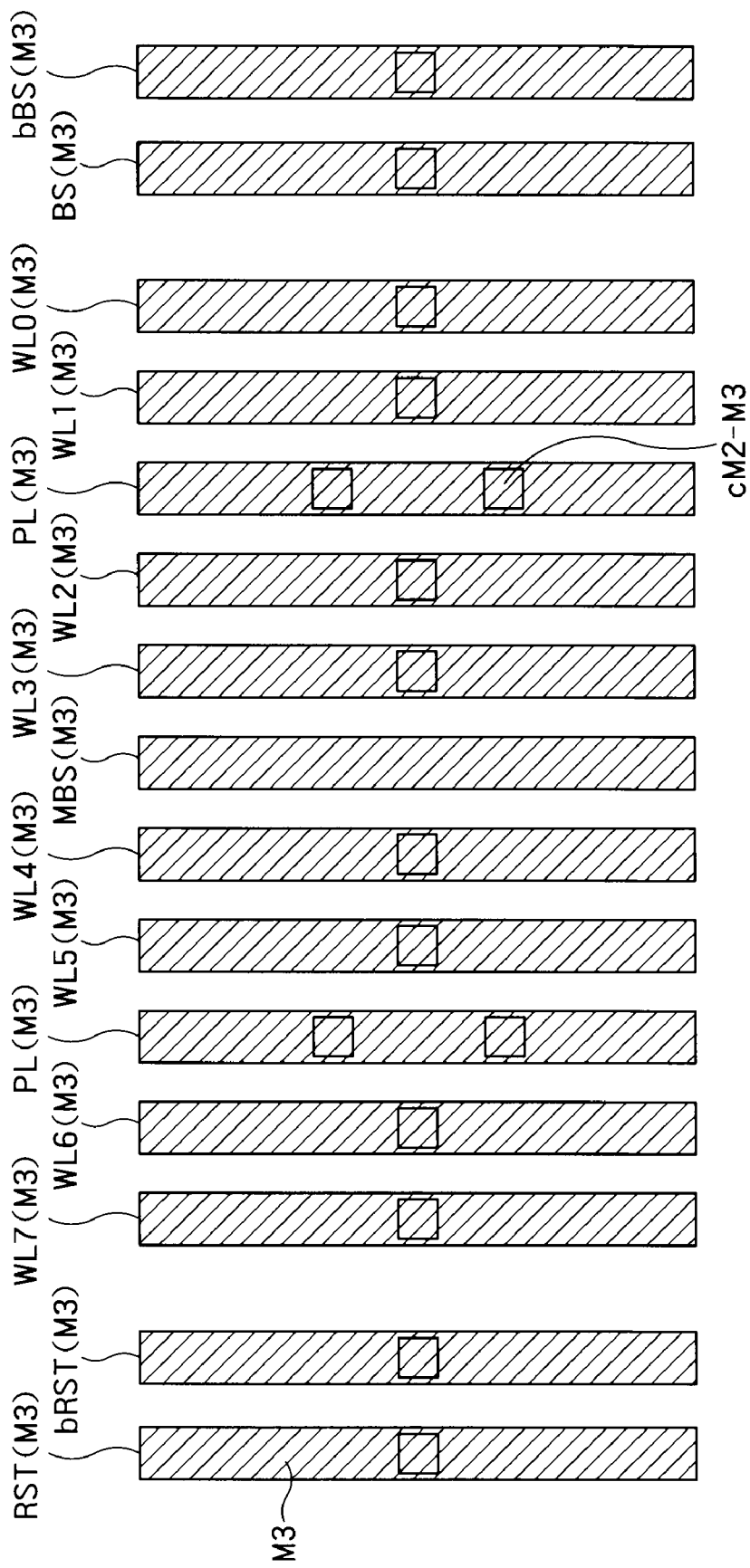

FIG. 22 shows mainly a layout of the third metal layers M3. More specifically, FIG. 22 shows a layout of the word line WLi (M3), the plate line PL (M3), the block selection lines bBS (M3), and BS (M3), the reset lines bRST (M3) and RST (M3), and a layout of a contact cM2-M3 between the second metal layer M2 and the third metal layer M3.

A plate line of the cell blocks CB0 and CB1 and a plate line of the cell blocks CB2 and CB3 are connected by a diffusion line in an extending direction of the word line as shown in FIG. 19. A plate line at a source side of a reset transistor is also connected by a diffusion layer in an extending direction of the word line. In a shunt region at the center of the layout shown in FIG. 18 to FIG. 22, a contact cAA-M1 connects the plate line formed by the diffusion layer to the plate line PL (M1) shown in FIG. 20. Further, the plate line is connected to the plate line PL (M3) of the third metal layer M3 via the contact cM1-M2, the second metal layer M2, and the contact cM2-M3. Accordingly, resistance of the plate line PL is decreased.

In the shunt region, the word line WL, the reset lines bRST and RST, and the block selection lines bBS and BS are also connected to the third metal layer M3, at are set to low resistance. When the wirings of the first metal layer M1 and the second metal layer M2 are extended to an extending direction of the bit line, the wiring of the third metal layer M3 can be deviated to an optional position. Positions of the masks D-Imp of depletion transistors are alternately shifted for each bit line. Accordingly, cell blocks adjacent in an extending direction of the word line are controlled by mutually different block selection signals and mutually different reset signals.

Ninth Embodiment

FIG. 23 to FIG. 28 are cross-sectional views and plane layout diagrams of a ferroelectric memory according to the ninth embodiment. The ninth embodiment is different from the sixth embodiment (see FIG. 9 to FIG. 12) in that the ferroelectric memory has a plate metal layer M0 provided between the plate line PL including a diffusion layer and the first metal layer M1. Other configurations of the ninth embodiment can be identical to those of the sixth embodiment.

Figure 23:
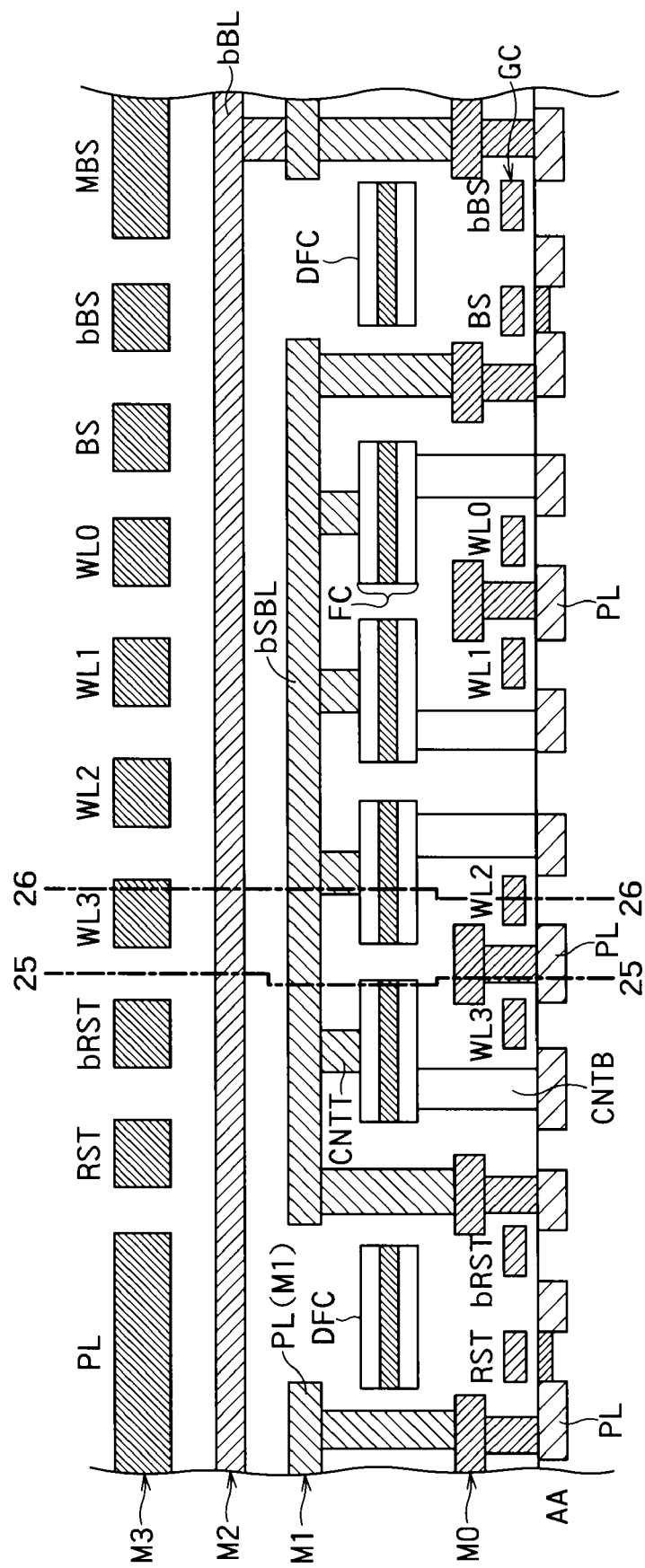
FIG. 23 to FIG. 28 are cross-sectional views and plane layout diagrams of a ferroelectric memory according to the ninth embodiment.
Figure 24:
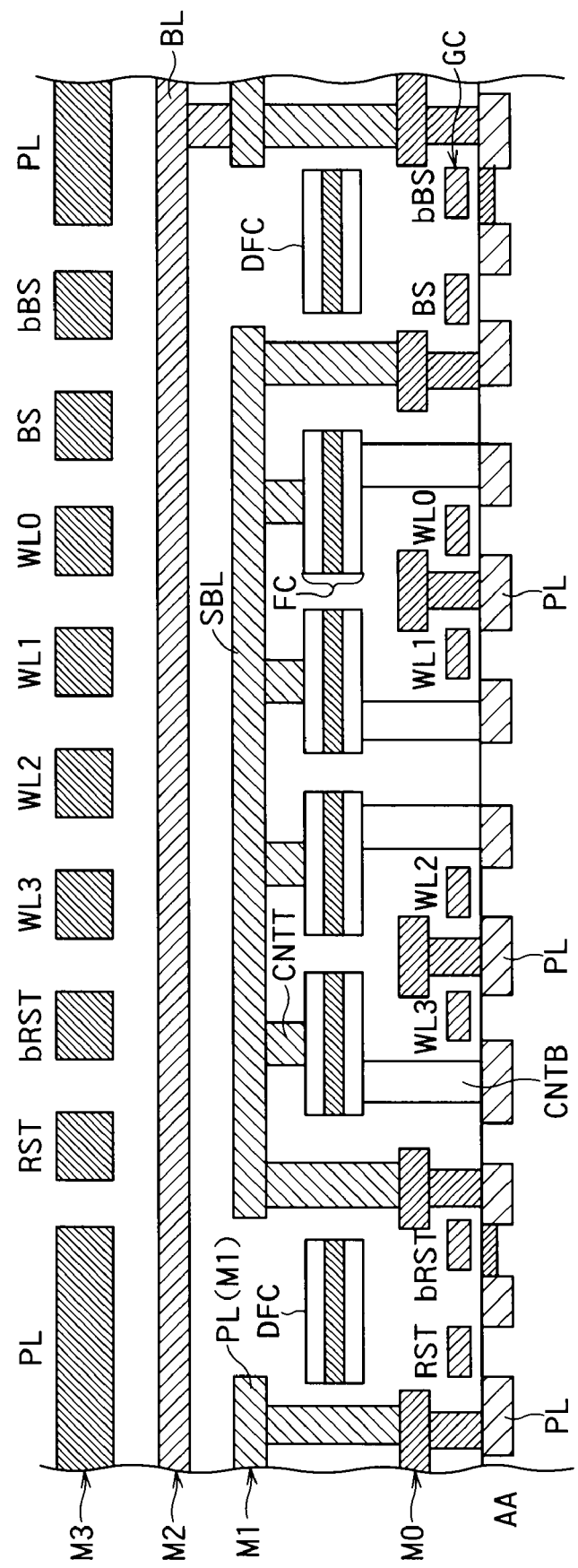
Figure 25:
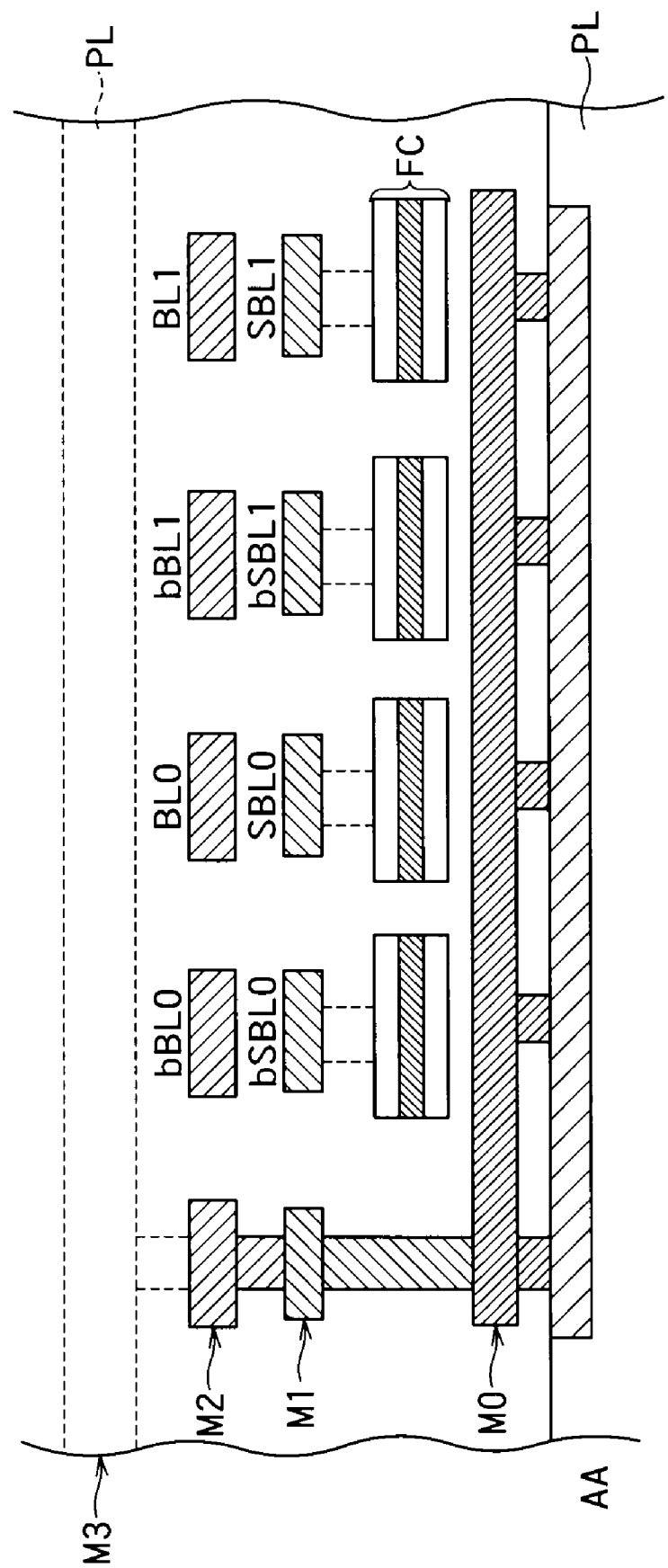
Figure 26:
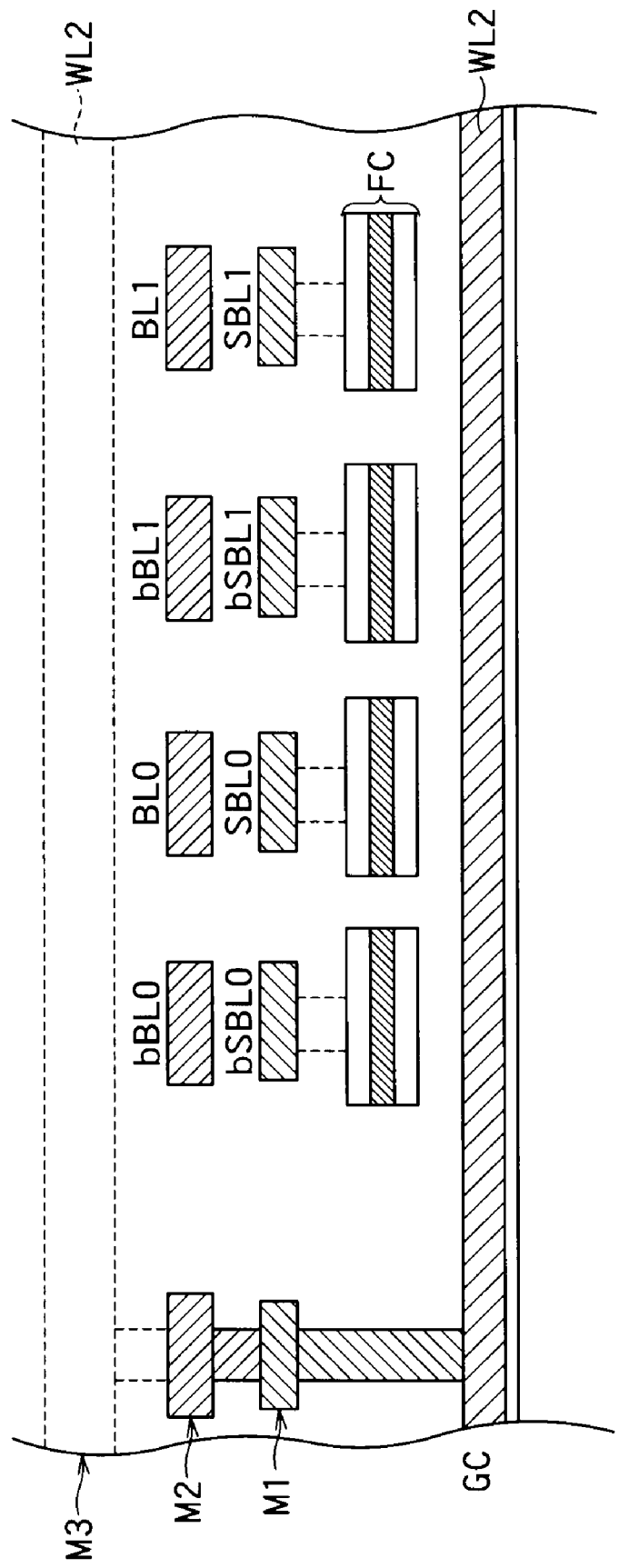

FIG. 25 is a cross-sectional view along a line 25-25 in FIG. 23, and FIG. 26 is a cross-sectional view along a line 26-26 in FIG. 23.

Figure 27:
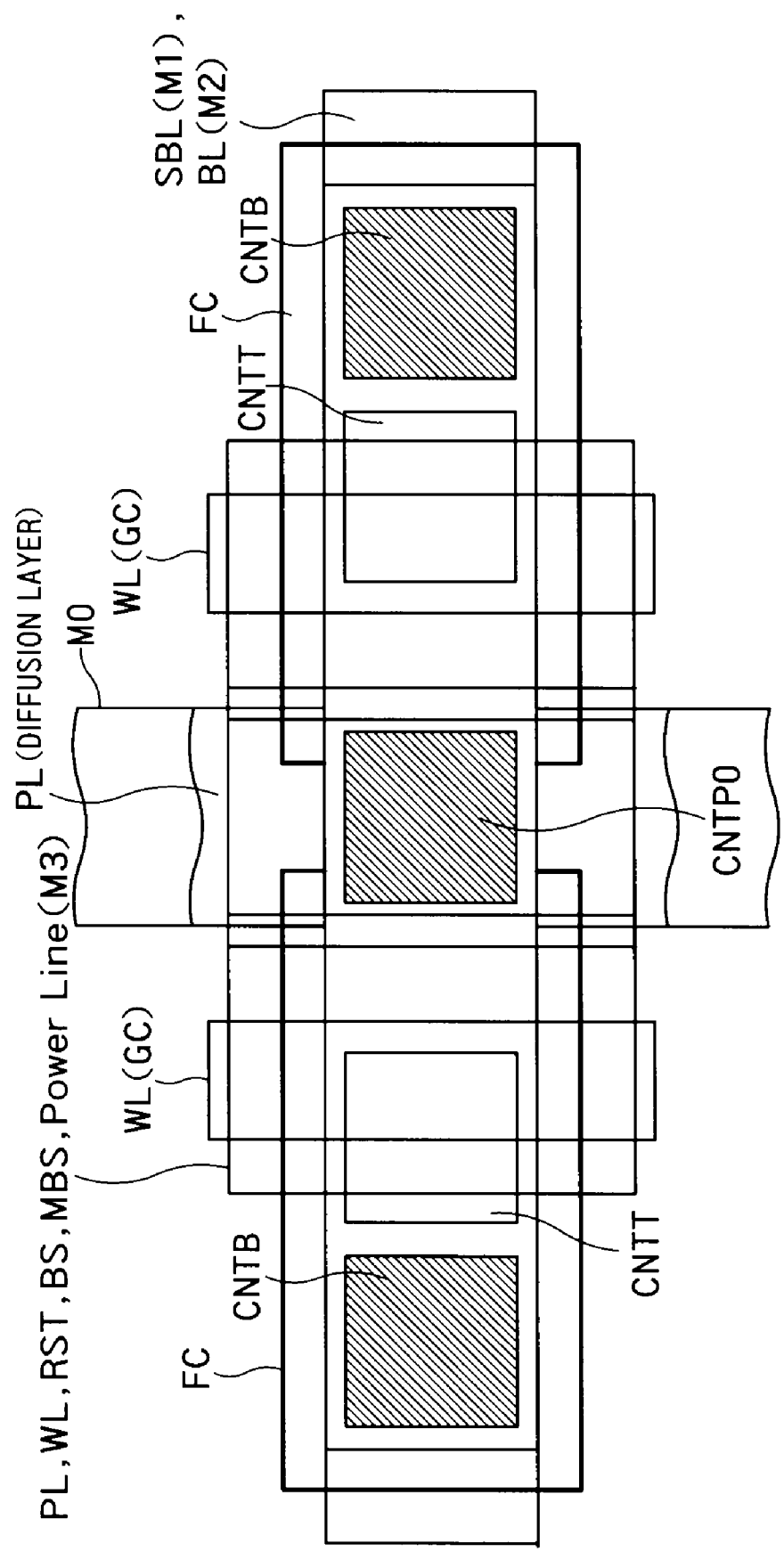

FIG. 27 is a plane layout diagram of a memory cell MC according to the ninth embodiment. The memory cell MC shown in FIG. 27 is different from the memory cell MC shown in FIG. 13 in that the memory cell MC has the plate metal layer M0 between two adjacent ferroelectric capacitors FC. The plate metal layer M0 is connected to the plate line PL (diffusion layer) via a contact CNTP0. Other configurations of the memory cell MC in FIG. 27 are identical to those of the memory cell MC shown in FIG. 13.

Figure 28:
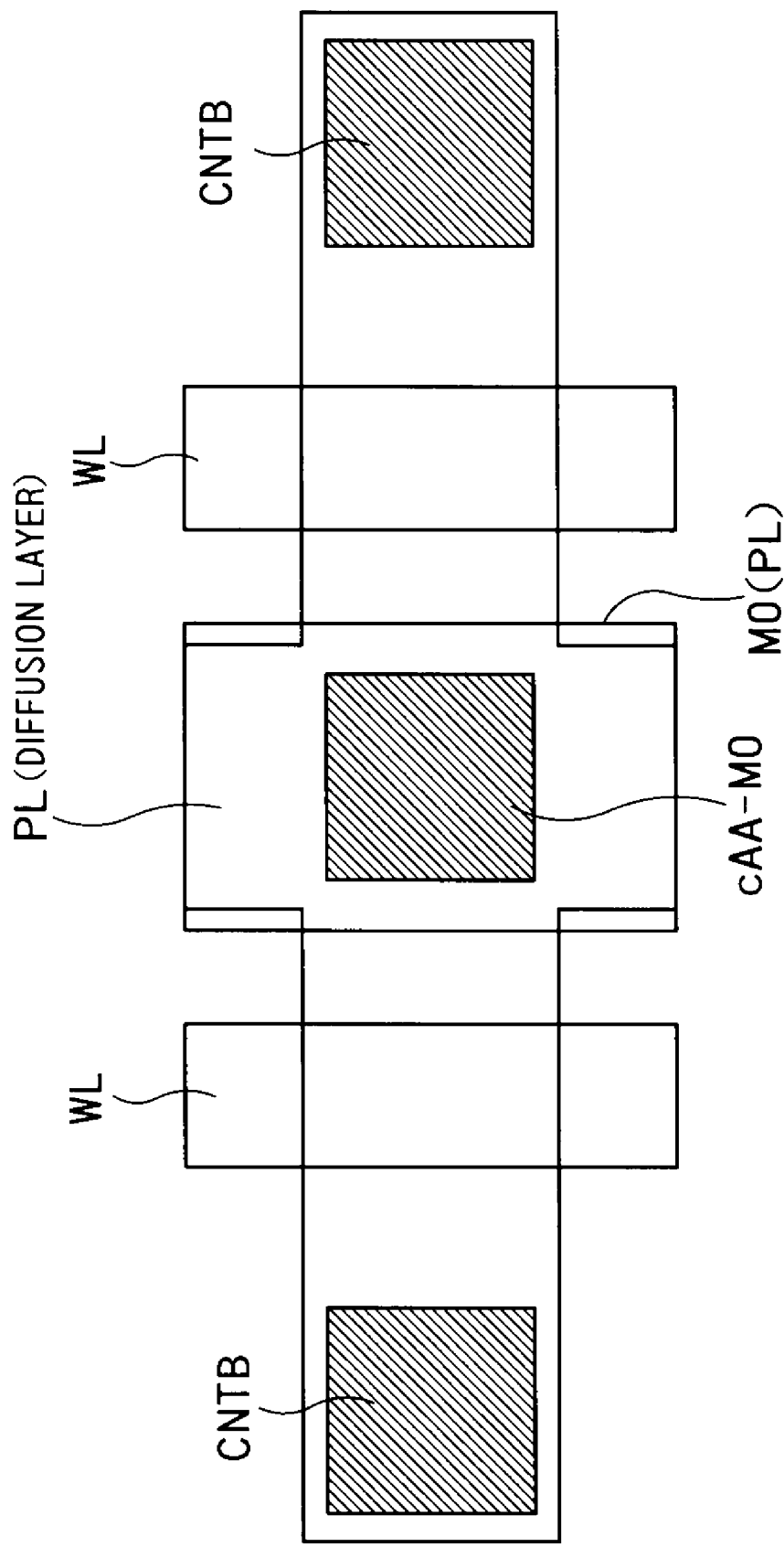

FIG. 28 is a plane layout diagram showing the plate line PL including a diffusion layer, contacts cAA-M0 and CNTB, the plate metal layer M0 (PL), and the word line WL, to facilitate the understanding. The layout of other configurations is identical to those of the layouts shown in FIG. 15 and FIG. 16.

The plate metal layer M0 is formed by silicide (WSi, NiSi, and CoSi, for example) having resistance against high-temperature heat treatment. The plate metal layer M0 is extended along a diffusion layer of the plate line PL (to an extending direction of the word line) above this diffusion layer, and is shunted by the diffusion layer via the contact cAA-M0. The plate metal layers M0 are formed below the ferroelectric capacitors FC based on the substrate, and are arranged at each constant number of memory cells arranged in an extending direction of the bit line. While the plate metal layer M0 is formed below the ferroelectric capacitor FC, the plate metal layer M0 is formed by silicide, and can bear heat treatment at the time of forming the ferroelectric capacitor FC.

The plate metal layer M0 can decrease the wiring resistance of the plate diffusion layer. Therefore, it is sufficient when the plate lines PL (M3) formed by the third metal layers M3 are provided at a larger distance (a distance between more memory cells) than that of the sixth embodiment. The ninth embodiment can be applied to the above and the following embodiments instead of the sixth embodiment.

In the ninth embodiment, a bit line and a sub-bit line are not provided below the ferroelectric capacitor. Therefore, even when the plate metal layer M0 is provided, bit line capacitance does not increase. An interval corresponding to a width of the word line WL is present between the plate metal layer M0 and the lower electrode contact CNTB. Therefore, a cell size does not increase.

By combining the ninth embodiment to other embodiments, the ninth embodiment can achieve the effects of the combined embodiments.

Tenth Embodiment

Figure 29:
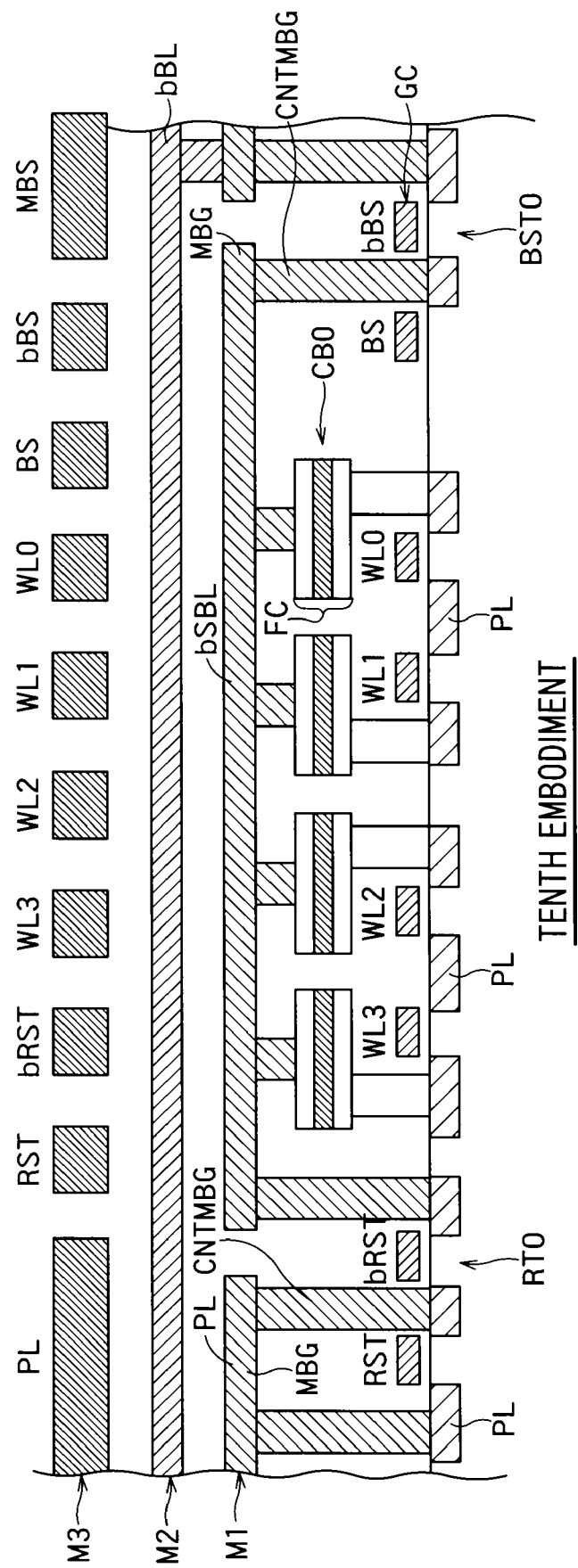
FIG. 29 and FIG. 30 are cross-sectional views of a ferroelectric memory according to a tenth embodiment of the present invention.
Figure 30:
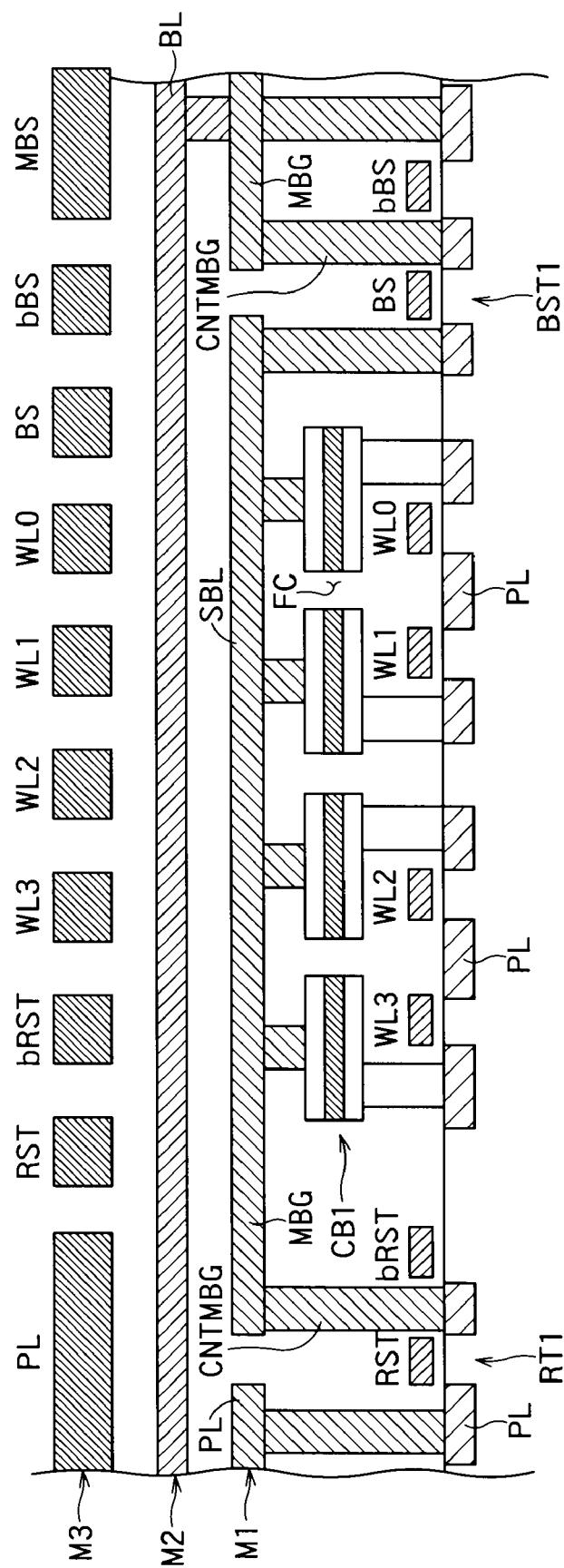

FIG. 29 and FIG. 30 are cross-sectional views of a ferroelectric memory according to a tenth embodiment of the present invention. The tenth embodiment is different from the eighth embodiment in that the block selection lines bBS and BS and the reset line bRST or RST are passed (stridden) using a metal bridge MBG formed by the first metal layer M1, without using a depletion transistor in the block selection transistor. The metal bridge MBG includes a part of the first metal layer M1, and a contact CNTMBG connecting between M1 and a diffusion layer. Other configurations of the tenth embodiment can be identical to those of the eighth embodiment.

In the tenth embodiment, while a depletion transistor is not necessary, a dummy ferroelectric capacitor cannot be arranged on the block selection transistors BST0 and BST1, and the reset transistors RT0 and RT1.

Eleventh Embodiment

Figure 31:
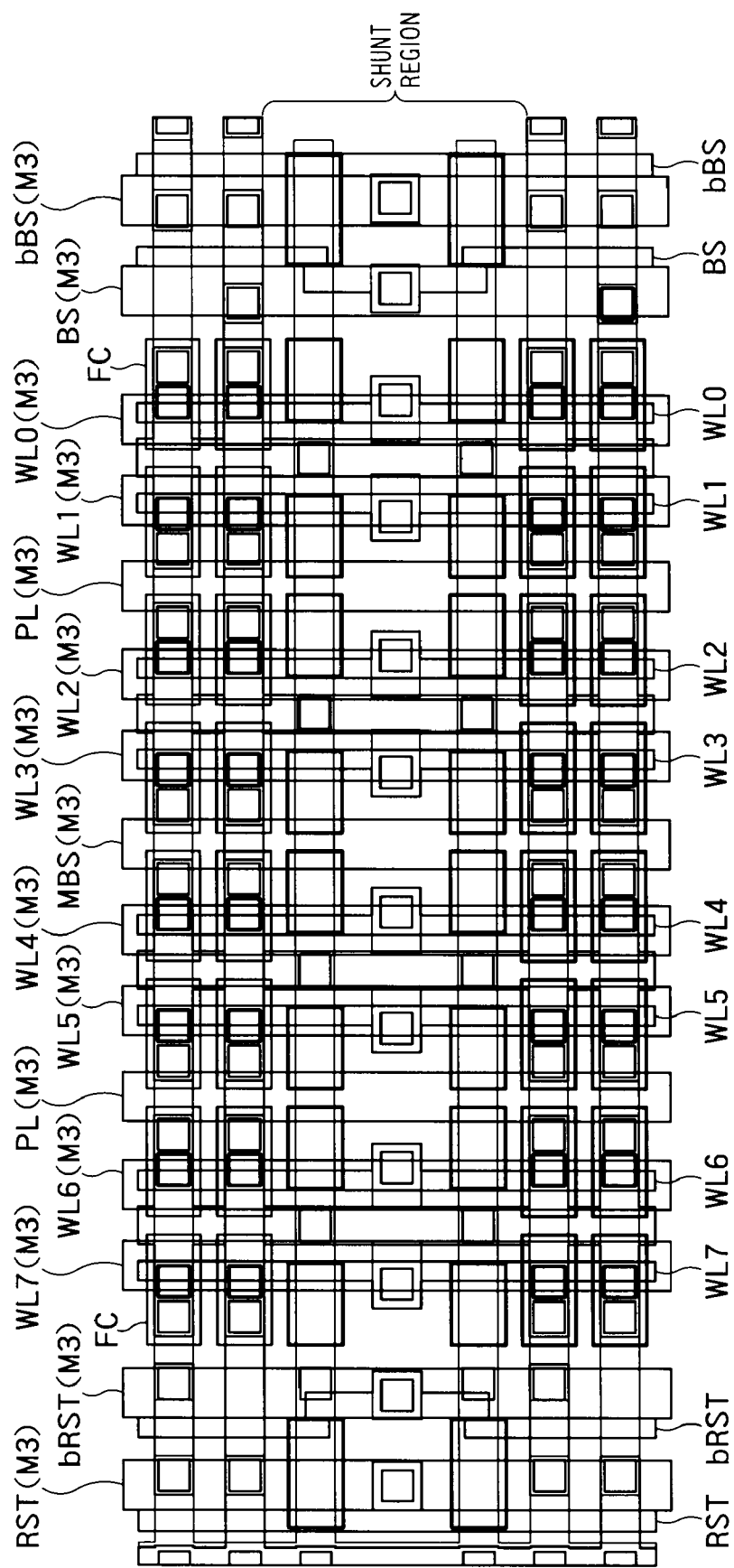
FIG. 31 is a plane layout diagram of an eleventh embodiment.

FIG. 31 is a plane layout diagram of an eleventh embodiment. The eleventh embodiment is a combination of the tenth and seventh embodiments. Therefore, cell blocks adjacent in an extending direction of a bit line share a plate line. A layout of the tenth embodiment is different from the layout shown in FIG. 18 in that channel implantation masks D-imp for depletion are not necessary, and that a diffusion layer of a block selection transistor or a diffusion layer of a reset transistor is connected by the above memory cell bridge MBG. Other layouts shown in FIG. 31 can be identical those shown in FIG. 18.

Figure 32:
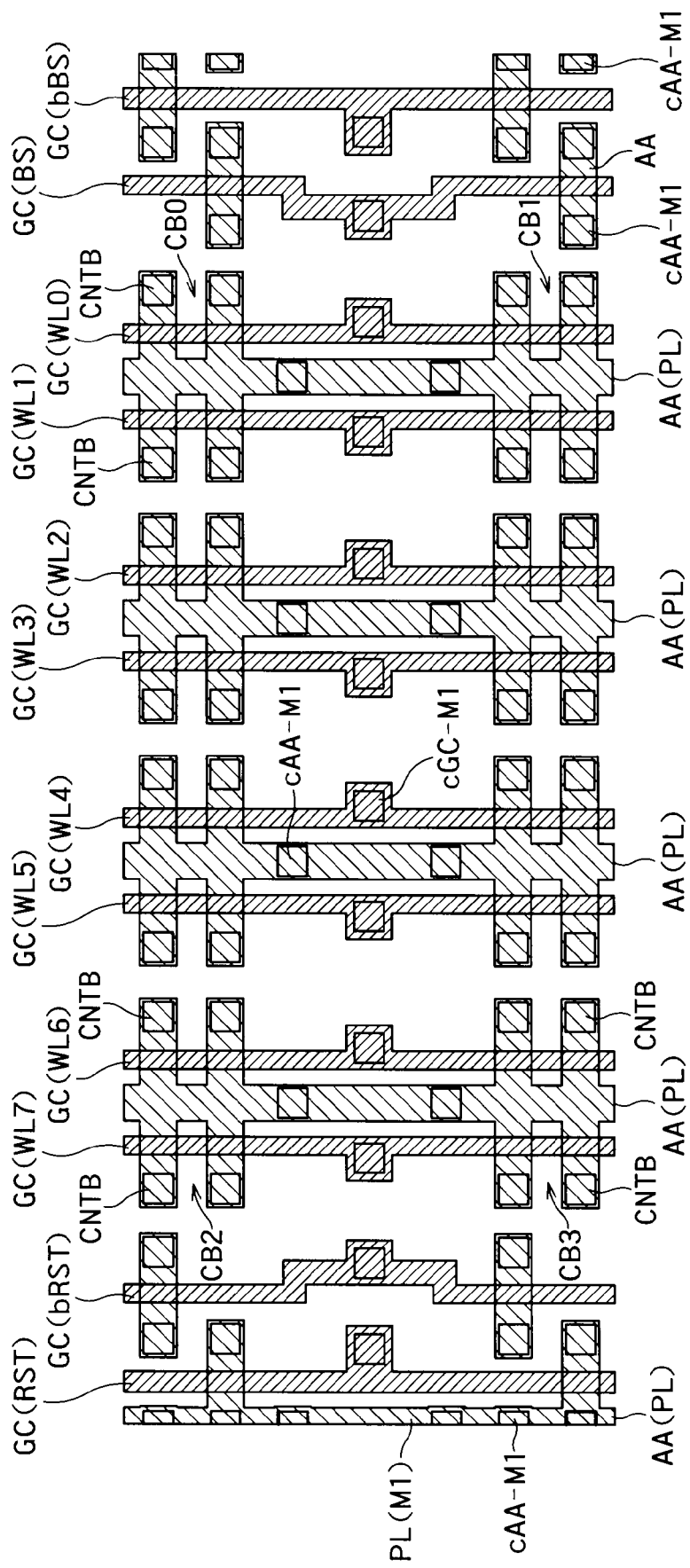
FIG. 32 and FIG. 33 display the layout of FIG. 31 by dividing this layout into layers.
Figure 33:
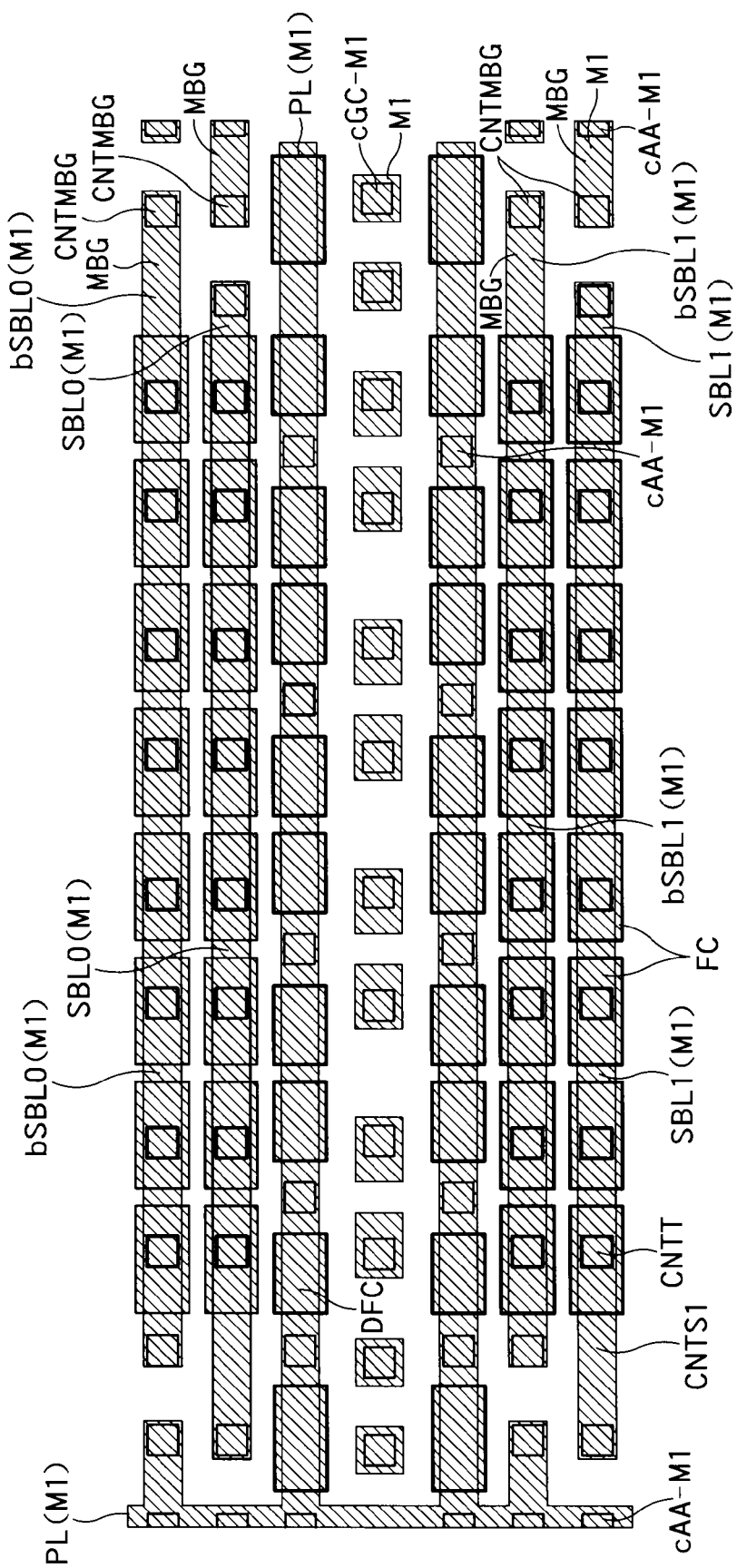

FIG. 32 and FIG. 33 display the layout of FIG. 31 by dividing this layout into layers. FIG. 32 corresponds to FIG. 19. However, in the layout shown in FIG. 32, a channel ion implantation is not performed in a region wired by the metal bridge MBG. FIG. 33 corresponds to FIG. 20. As shown in FIG. 33, the metal bridges MBG are formed by the first metal layers M1 and the contacts CNTMBG. Other layers of the eleventh embodiment are identical to the layers shown in FIG. 21 and FIG. 22.

Twelfth Embodiment

Figure 34:
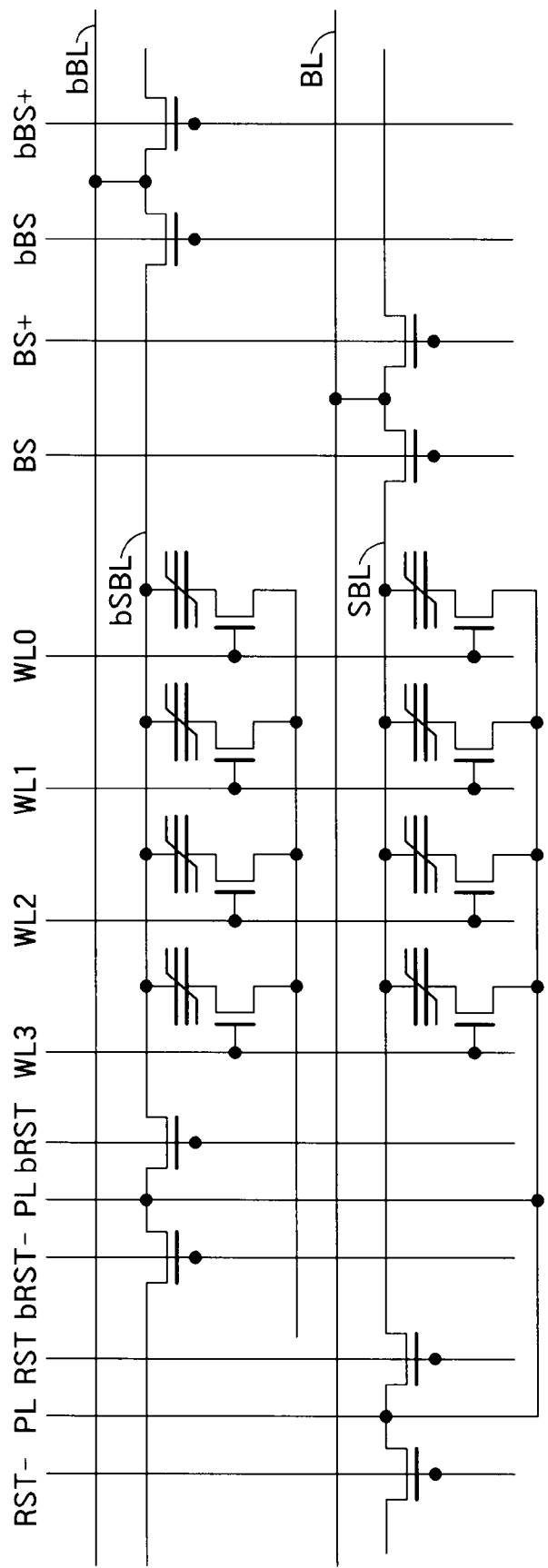
FIG. 34 is a circuit diagram of a ferroelectric memory according to a twelfth embodiment of the present invention.
Figure 35:
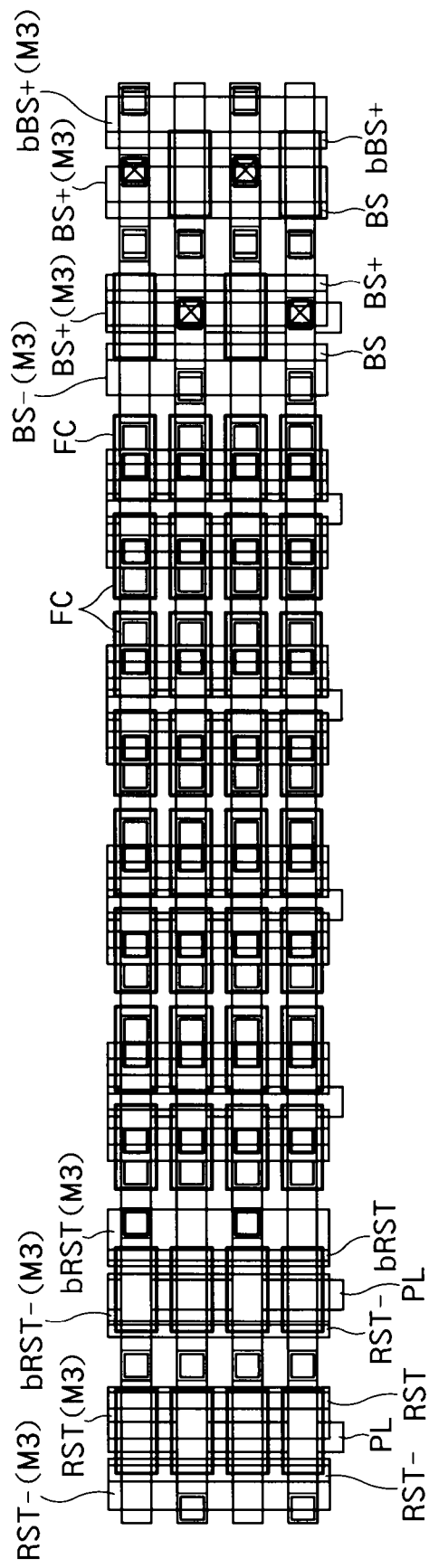
FIG. 35 to FIG. 39 are plane layout diagrams according to the twelfth embodiment.
Figure 36:
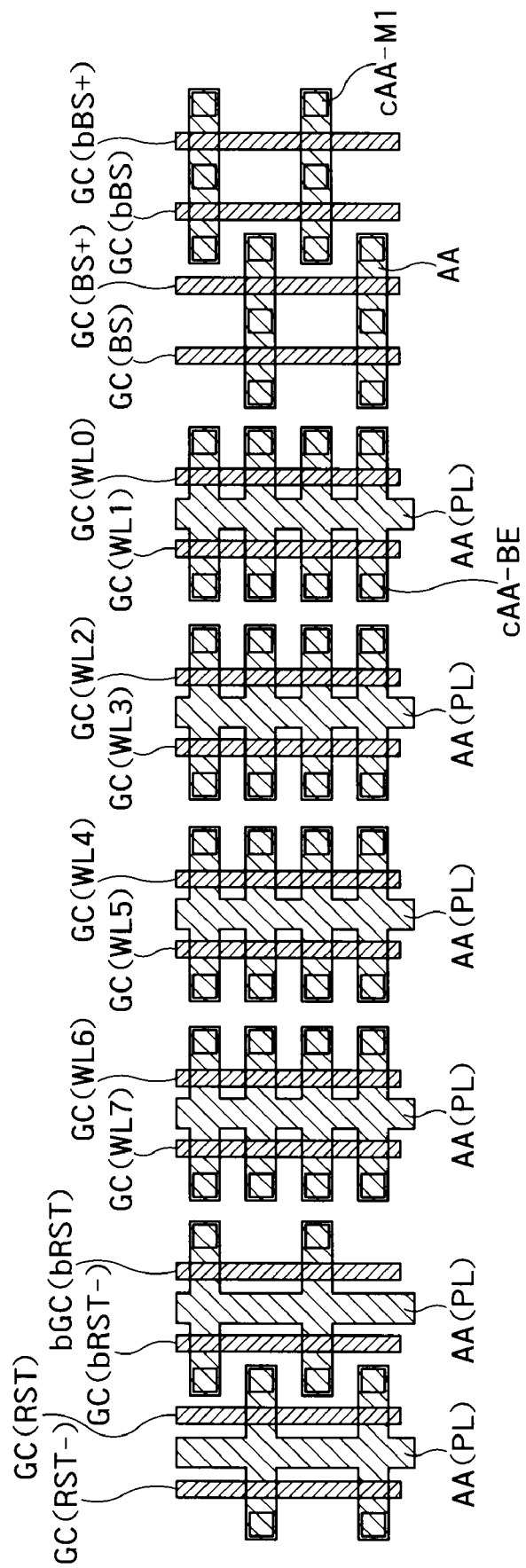
Figure 37:
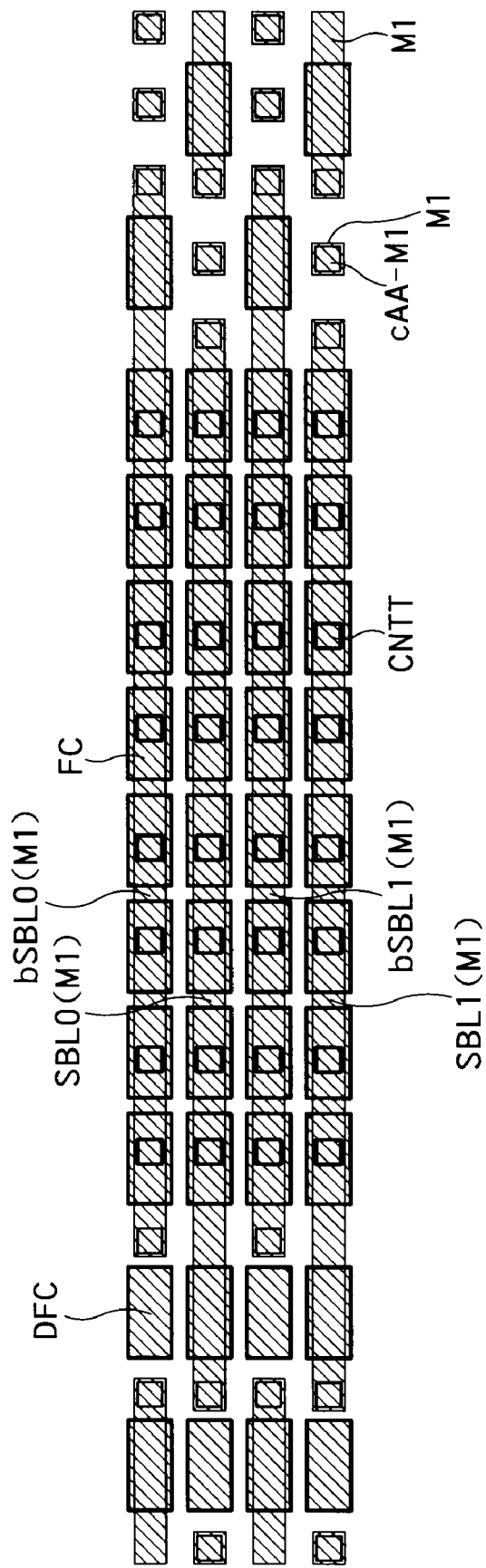
Figure 38:
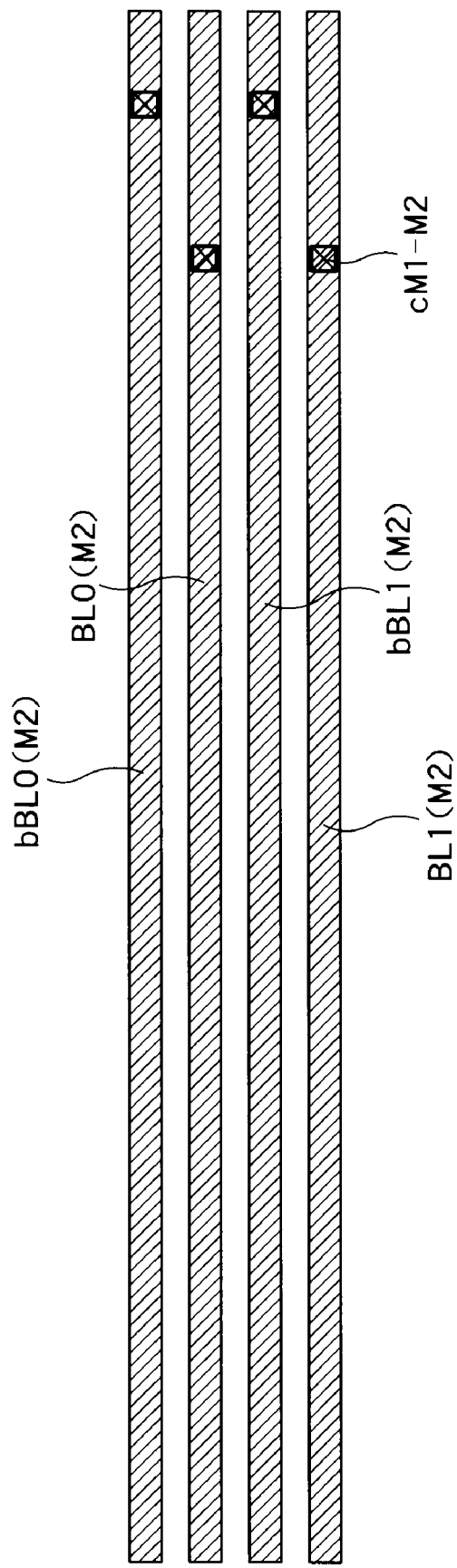
Figure 39:
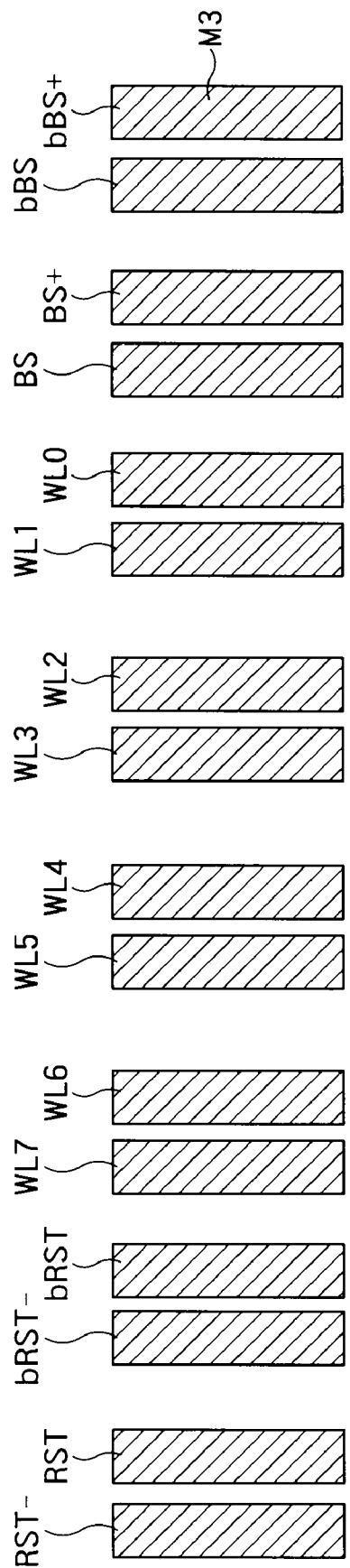

FIG. 34 is a circuit diagram of a ferroelectric memory according to a twelfth embodiment of the present invention. Bit selection lines BS+ and bBS+ are provided corresponding to cell blocks adjacent by sandwiching the bit selection lines BS, bBS. Reset lines RST− and bRST− are provided corresponding to cell blocks adjacent by sandwiching the reset lines RST and bRST.

FIG. 35 to FIG. 39 are plane layout diagrams according to the twelfth embodiment. In forming the above metal bridges MBG, many contacts CNTMBG are necessary. However, in the twelfth embodiment, the number of contacts can be decreased by changing a positional relationship between the block selection lines bBS and BS and the block selection lines bBS+ and BS+ of cell blocks adjacent to the block selection lines bBS+ and BS. Similarly, the number of contacts can be decreased by changing a positional relationship between the reset lines bRST and RST and the reset lines bRST− and RST− of cell blocks adjacent to the reset lines bRST and RST.

Other configurations of the twelfth embodiment can be identical to those of the tenth embodiment.

Thirteenth Embodiment

Figure 40:
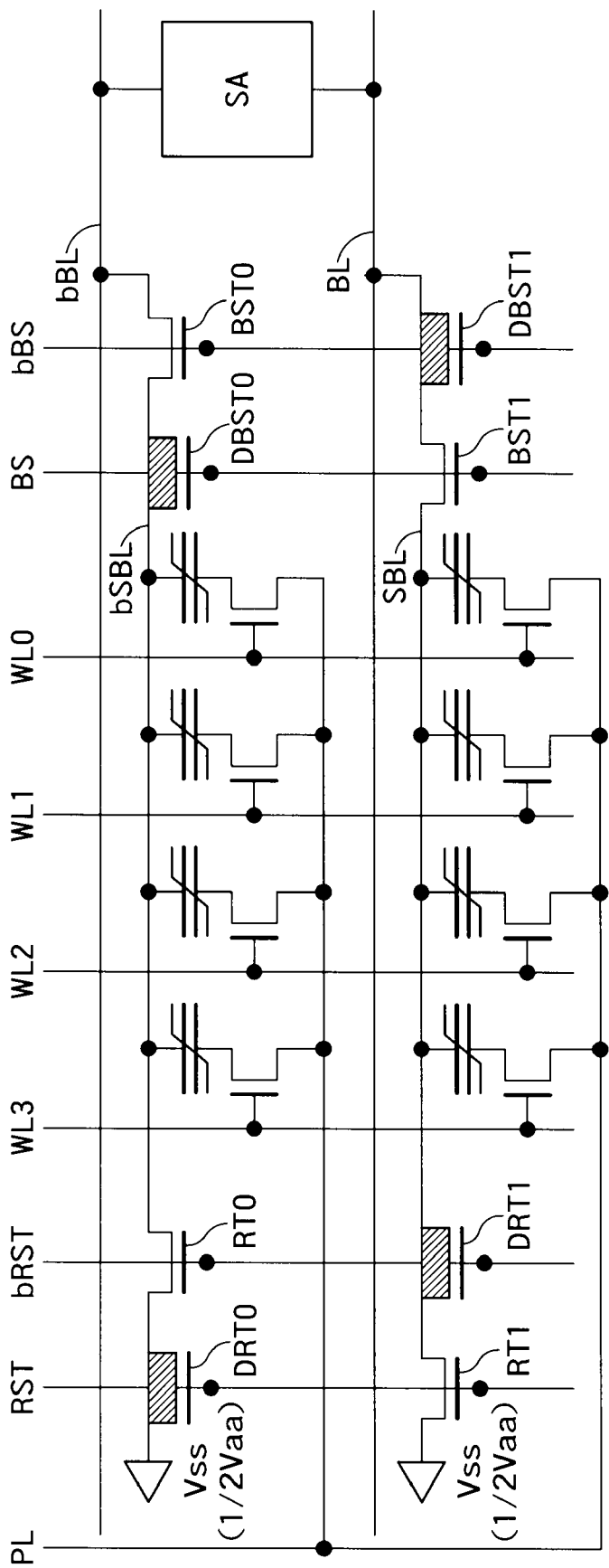
FIG. 40 is a circuit diagram of a ferroelectric memory according to a thirteenth embodiment of the present invention.

FIG. 40 is a circuit diagram of a ferroelectric memory according to a thirteenth embodiment of the present invention. The thirteenth embodiment is different from the above embodiments in that source potentials of the reset transistors RT0 and RT1 are set to the fixed reset potential Vss or ½ Vaa. The fixed reset potential can be the same as the plate potential during the standby period, and is not limited to Vss or ½ Vaa. The cross-sectional configuration of the thirteenth embodiment is identical to the cross-sectional configurations shown in FIG. 9 to FIG. 12.

In the thirteenth embodiment, a source of the reset transistor RT0 is connected to a fixed reset potential via the depletion transistor DRT0. A drain of the reset transistor RT1 is connected to the sub-bit line SBL via the depletion transistors DRT1.

Figure 41:
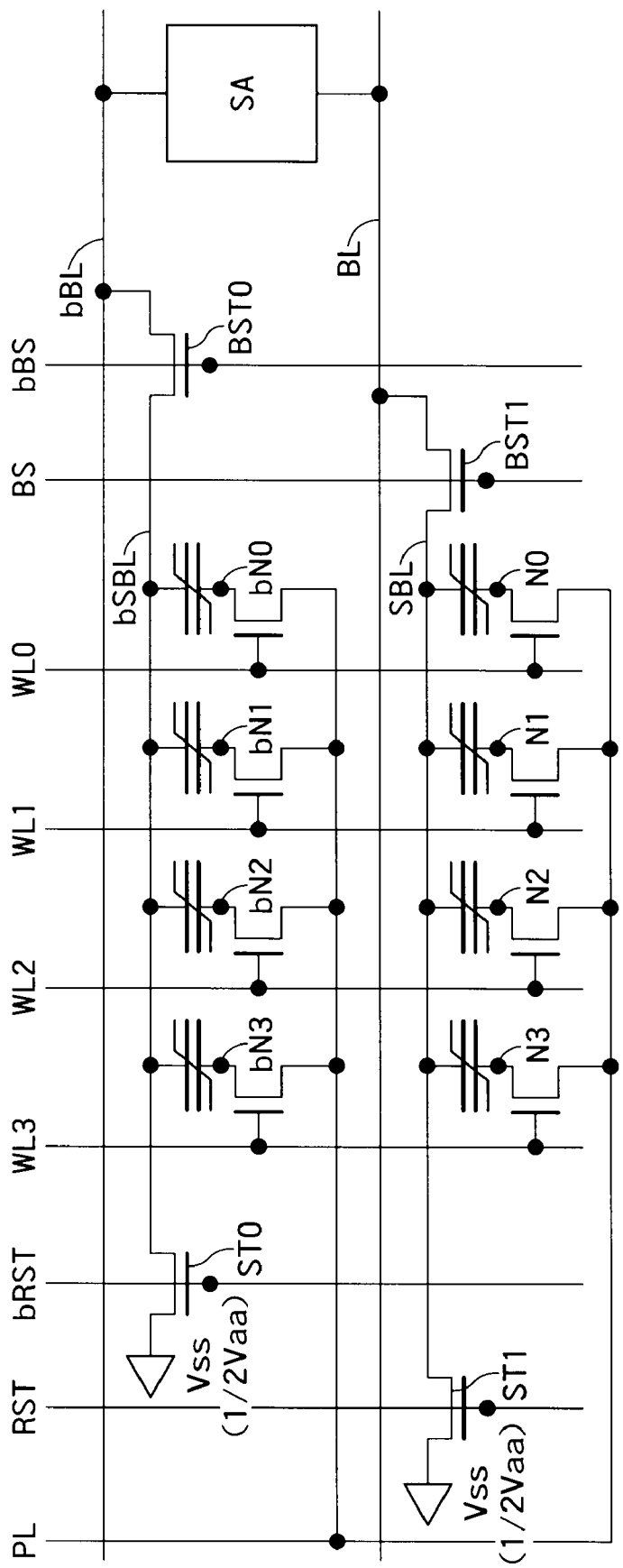
FIG. 41 is a circuit diagram when the metal bridges MBG are employed.

However, the metal bridges MBG can be employed as shown in FIG. 41 instead of the depletion transistors DRT0 and DRT1. Further, the metal bridges MBG can be employed as shown in FIG. 41 instead of the depletion transistors DBST0 and CBST1. FIG. 41 is a circuit diagram when the metal bridges MBG are employed. The cross-sectional configuration when the metal bridges MGS are employed is identical to the cross-sectional configurations shown in FIG. 29 and FIG. 30.

During the standby period, source potentials of the reset transistors RT0 and RT1 are equal to the potential of the plate line PL, and therefore, are in the same state as that during the standby period in the fourth embodiment (FIG. 5).

During the active period (during a read or write operation), a reset transistor of a selection block is in the off state. Therefore, a source of the reset transistor can be connected to the fixed reset potential. While a reset transistor of a non-selection block is in the on state, there is no potential difference between both electrodes of the ferroelectric capacitor FC, and therefore any problem is occurred. In finishing the active operation, the reset transistor and the cell transistor are turned on after the plate line potential is returned to the fixed reset potential.

As described above, the ferroelectric memory shown in FIGS. 40 and 41 can achieve the effects of the fourth embodiment. Further, by combining the thirteenth embodiment to other embodiments, the thirteenth embodiment can achieve the effects of the combined embodiments.

The invention claimed is:
1. A semiconductor memory device comprising:
word lines;
bit lines;
plate lines;
sub-bit lines connected to the bit lines;
ferroelectric capacitors each including a ferroelectric substance between two electrodes;
cell transistors each including a drain connected to one electrode of each ferroelectric capacitor, and a gate connected to the word line or functioning as the word line; and
memory cell blocks each including a reset transistor, a block selection transistor, and a plurality of memory cells including the ferroelectric capacitors and the cell transistors, wherein
sources of the cell transistors of the memory cells are connected to the plate lines, the other electrode of the ferroelectric capacitor of each of the memory cells is connected to one of the sub-bit lines, a source and a drain of the block selection transistor in each memory cell block are connected to one of the sub-bit lines and one of the bit lines, respectively, a source of the reset transistor in each memory cell block is connected to one of the plate lines or a fixed potential, and a drain of the reset transistor in each memory cell block is connected to one of the sub-bit lines, and
a plurality of the memory cell blocks configure a memory cell array, wherein
during a standby period when a data read operation or a data write operation is not performed, the cell transistors are in an on state, the reset transistors are in an on state, and the block selection transistors are in an off state, and
in a memory cell block selected from the memory cell blocks during a data read operation or a data write operation, the reset transistor in the selected memory cell block is in an off state, the block selection transistor in the selected memory cell block is in an on state, and the cell transistor of a selected one of the memory cells in the selected memory cell block is in an on state.

2. The semiconductor memory device according to claim 1, wherein
the sub-bit lines are provided above the ferroelectric capacitors, and
the plate lines are configured by diffusion layers extended to an extending direction of the word lines.

3. The semiconductor memory device according to claim 2, further comprising metal wirings formed above the ferroelectric capacitors and extended to an extending direction of the word lines, the metal wirings being arranged at each interval of a predetermined number of the memory cells arranged in an extending direction of the bit lines, wherein
the plate lines constituted by the diffusion layers are connected to the metal wirings.

4. The semiconductor memory device according to claim 2, further comprising silicide wirings formed below the ferroelectric capacitor and extended to an extending direction of the word lines, the silicide wirings being arranged at each interval of a predetermined number of the memory cells arranged in an extending direction of the bit lines, wherein
the plate lines constituted by the diffusion layers are connected to the silicide wirings.

5. The semiconductor memory device according to claim 1, wherein, when a data read operation or a data write operation is finished, a potential of the bit lines are returned to a potential of the bit lines in the standby state, and thereafter, a potential of a word line selected from the word lines is returned to a potential of the word line in the standby state, and
thereafter, a word line different from the word line selected in the data read operation or the data write operation is started to reset a potential of a cell node between the ferroelectric capacitor and the cell transistor to a potential of the plate line.

6. A semiconductor memory device comprising:
word lines;
bit lines;
plate lines;
sub-bit lines connected to the bit lines;

ferroelectric capacitors each including a ferroelectric substance between two electrodes;
cell transistors each including a drain connected to one electrode of each ferroelectric capacitor, and a gate connected to the word line or functioning as the word line;
a first memory cell block including a first reset transistor, a first block selection transistor, and a plurality of memory cells including the ferroelectric capacitors and the cell transistors; and
a second memory cell block including a second reset transistor, a second block selection transistor, and a plurality of memory cells including the ferroelectric capacitors and the cell transistors, the second memory cell block being adjacent to the first memory cell block, wherein
in the first memory cell block, sources of the cell transistors of the memory cells are connected to the plate lines, the other electrode of the ferroelectric capacitor of each of the memory cells is connected to a first sub-bit line of the sub-bit lines, a source of the first reset transistor is connected to the plate line or a fixed potential, a drain of the first reset transistor is connected to the first sub-bit line, a source of the first block selection transistor is connected to the first sub-bit line, and a drain of the first block selection transistor is connected to one of the bit lines, and
in the second memory cell block, sources of the cell transistors of the memory cells are connected to the plate lines, the other electrode of the ferroelectric capacitor of each of the memory cells is connected to a second sub-bit line of the sub-bit lines, a source of the second reset transistor is connected to the plate line or a fixed potential, a drain of the second reset transistor is connected to the second sub-bit line, a source of the second block selection transistor is connected to the second sub-bit line, and a drain of the second block selection transistor is connected to one of the bit lines, wherein
during a standby period when a data read operation or a data write operation is not performed, the cell transistor is in an on state, the first and the second reset transistors are in an on state, and the first and the second block selection transistors are in an off state, and
in the first memory cell block selected during a data read operation or a data write operation, the first reset transistor is in an off state, the first block selection transistor is in an on state, and the cell transistor of a selected one of the memory cells is in an on state.

7. The semiconductor memory device according to claim 6, wherein
the first and the second sub-bit lines are provided above the ferroelectric capacitors, and
the plate lines are configured by diffusion layers extended to an extending direction of the word lines.

8. The semiconductor memory device according to claim 7, further comprising metal wirings formed above the ferroelectric capacitors and extended to an extending direction of the word lines, the metal wirings being arranged at each interval of a predetermined number of the memory cells arranged in an extending direction of the bit lines, wherein
the plate lines constituted by the diffusion layers are connected to the metal wirings.

9. The semiconductor memory device according to claim 7, further comprising silicide wirings formed below the ferroelectric capacitor and extended to an extending direction of the word lines, the silicide wirings being arranged at each interval of a predetermined number of the memory cells arranged in an extending direction of the bit lines, wherein
the plate lines constituted by the diffusion layers are connected to the silicide wirings.

10. The semiconductor memory device according to claim 6, wherein, when a data read operation or a data write operation is finished, a potential of the bit lines are returned to a potential of the bit lines in the standby state, and thereafter, a potential of a word line selected from the word lines is returned to a potential of the word line in the standby state, and
thereafter, a word line different from a word line selected in the data read operation or the data write operation is started to reset a potential of a cell node between the ferroelectric capacitor and the cell transistor to a potential of the plate line.

11. A semiconductor memory device comprising:
word lines;
bit lines;
plate lines;
sub-bit lines connected to the bit lines;
ferroelectric capacitors each including a ferroelectric substance between two electrodes;
cell transistors each including a drain connected to one electrode of each ferroelectric capacitor, and a gate connected to the word line or functioning as the word line; and
memory cell blocks each including a reset transistor, a block selection transistor, and a plurality of memory cells including the ferroelectric capacitors and the cell transistors, wherein
when a data read operation or a data write operation is finished, a potential of the bit lines is returned to a potential of the bit lines in a standby state in which a data read operation or a data write operation is not performed, and thereafter, a potential of a word line selected from the word lines is returned to a potential of the word line in the standby state, and
thereafter, a word line different from the word line selected in the data read operation or the data write operation is started to reset a potential of a cell node between the ferroelectric capacitor and the cell transistor to a potential of the plate line.

* * * * *